United States Patent [19]
Patel et al.

[11] Patent Number: 5,731,848
[45] Date of Patent: Mar. 24, 1998

[54] DIGITAL VSB DETECTOR WITH BANDPASS PHASE TRACKER USING NG FILTERS, AS FOR USE IN AN HDTV RECEIVER

[75] Inventors: C. B. Patel, Hopewell, N.J.; Allen LeRoy Limberg, Vienna, Va.

[73] Assignee: Samsung Electronics Co., Ltd., Kyungki-do, Rep. of Korea

[21] Appl. No.: 577,469

[22] Filed: Dec. 22, 1995

[51] Int. Cl.$^6$ .................................................. H04N 5/21
[52] U.S. Cl. ........................... 348/614; 348/725; 375/346
[58] Field of Search ........................ 348/614, 607, 348/611, 608, 21, 725, 726; 375/216, 346

[56] References Cited

U.S. PATENT DOCUMENTS

| | | | |
|---|---|---|---|
| 5,331,416 | 7/1994 | Patel et al. | 348/614 |
| 5,483,292 | 1/1996 | Ko | 348/614 |
| 5,532,755 | 7/1996 | Patel et al. | 348/614 |
| 5,548,617 | 8/1996 | Patel et al. | 375/216 |

*Primary Examiner*—Victor R. Kostak
*Attorney, Agent, or Firm*—Sughrue, Mion, Zinn, Macpeak & Seas, PLLC

[57] ABSTRACT

In a radio receiver for receiving vestigial sideband (VSB) signals including symbol codes descriptive of digital signals, HDTV signals being exemplary of such VSB signals, a tuner provides for selecting one of channels at different locations in a frequency band used for transmitting such VSB signals. The tuner also includes mixers for performing plural conversion of the selected channel to a final intermediate-frequency signal, which is digitized by an analog-to-digital converter. A phase tracker, operative on narrow-bandpass filtered portions of the digitized final intermediate-frequency signal centering on its carrier frequency, suppresses an imaginary portion of the final intermediate-frequency signal, arising from multipath distortion or from phase incoherency in local oscillations used during frequency conversion. A digital controlled oscillator in the phase tracker supplies digital descriptions of the carrier wave for the final intermediate-frequency signal to a synchronous detector, which synchronous detector detects the real portion of the digitized final intermediate-frequency signal in accordance with those digital descriptions of the carrier wave. The phase tracker generates the real and imaginary portions of the digitized final intermediate-frequency signal using a pair of all-pass digital filters, which exhibit a constant $\pi/2$ difference in phase response for the digitized bandpass signals and have finite impulse responses.

45 Claims, 6 Drawing Sheets

DIGITAL VSB DETECTOR WITH BANDPASS PHASE TRACKER USING NG FILTERS, AS FOR USE IN AN HDTV RECEIVER

The invention relates to the detection of vestigial sideband information in the digital regime, especially as it relates to digital high-definition television (HDTV) signal radio receivers.

BACKGROUND OF THE INVENTION

Vestigial sideband (VSB) signals that are used in certain transmissions of HDTV signal have their natural carrier wave, which would vary in amplitude depending on the percentage of modulation, replaced by a pilot carrier wave of fixed amplitude, which amplitude corresponds to a prescribed percentage of modulation. Such VSB signals will be used in over-the-air broadcasting within the United States, for example, and can be used in cable-casting systems. Digital HDTV signal radio receivers for these signals have been proposed, which are of a type that uses double-conversion in the tuner followed by synchronous detection. A frequency synthesizer generates first local oscillations that are heterodyned with the received television signals to generate first intermediate frequencies (e.g., with 920 MHz carrier). A passive LC bandpass filter selects these first intermediate frequencies from their image frequencies for amplification by a first intermediate-frequency amplifier, and the amplified first intermediate frequencies are filtered by a first surface-acoustic-wave (SAW) filter that rejects adjacent channel responses. The first intermediate frequencies are heterodyned with second local oscillations to generate second intermediate frequencies (e.g., with 41 MHz carrier), and a second SAW filter selects these second intermediate frequencies from their images and from remnant adjacent channel responses for amplification by a second intermediate-frequency amplifier. The response of the second intermediate-frequency amplifier is synchrodyned to baseband with third local oscillations of fixed frequency.

The third local oscillations of fixed frequency are supplied in 0°- and 90°-phasing, thereby implementing in-phase and quadrature-phase synchronous detection procedures. The in-phase synchronous detection result is eight-level coding of digital symbols when HDTV signals are broadcast, and the quadrature-phase synchronous detection result is nominally zero-valued. Separately digitizing in-phase and quadrature-phase synchronous detection results generated in the analog regime presents problems with regard to the synchronous detection results satisfactorily tracking each other after digitizing; quantization noise introduces pronounced phase errors in the complex signal considered as a phasor. This problem is avoided in HDTV signal radio receivers of the type previously proposed by performing the in-phase and quadrature-phase synchronous detection procedures in the digital regime.

By way of example, the in-phase and quadrature-phase synchronous detection procedures are implemented by sampling the response of the second intermediate-frequency amplifier at twice the Nyquist rate of the eight-level coding when digitizing. The successive samples are considered to be consecutively numbered in order of their occurrence; and odd samples and even samples are separated from each other to generate respective ones of the in-phase (or real) and quadrature-phase (or imaginary) synchronous detection results.

The eight-level coding in the digital in-phase synchronous detection result is filtered to remove co-channel interference from NTSC signals and is subjected to equalization filtering. The equalization filter response is supplied as input signal to a trellis decoder. The response of the trellis decoder is supplied as input signal to a data de-interleaver, and the de-interleaved data are supplied to a Reed-Solomon decoder. Error-corrected data are supplied to a data de-randomizer which regenerates packets of data for a packet decoder. Selected packets are used to reproduce the audio portions of the HDTV program, and other selected packets are used to reproduce the video portions of the HDTV program.

To implement the synchrodyning used in the in-phase and quadrature-phase synchronous detection procedures, the quadrature-phase synchronous detection results are used to develop automatic-frequency-and-phase-control (AFPC) signals for a controlled oscillator that generates the second local oscillations. The digital quadrature-phase synchronous detection result is low-pass filtered to generate an AFPC signal that adjusts the frequency and phase of the second local oscillations to minimize the amplitude of the quadrature-phase synchronous detection result. In practice however, this automatic frequency and phase control is inadequate in providing the desired degree of phase stability for the in-phase synchronous detection result. The adaptive equalization filtering of the digitized in-phase synchronous detection result can correct for static phase error in the synchrodyning used in the in-phase and quadrature-phase synchronous detection procedures, but the adaptive change in the filter coefficients of the equalization filtering is too slow to compensate for phase jitter in the AFPC feedback loop or for changes in phase error that occur during rapid changes in multipath reception of the HDTV signal.

Accordingly, in HDTV signal radio receivers of the type previously proposed, a phase tracker has been cascaded with the equalization filtering of the digitized in-phase synchronous detection result. The equalized in-phase synchronous detection result is supplied in digitized form to a Hilbert-transform finite-impulse-response filter. The response of this FIR filter and the equalized in-phase synchronous detection, as delayed to compensate for the latency of the Hilbert-transform FIR filter, are applied as real and imaginary input signals to a complex-number multiplier, to be multiplied by a complex-number multiplier signal for generating a complex-number product. A feedback loop ascertains the departure of the imaginary component of the complex-number product from zero to develop an error signal for adjusting the phase angle of the unit Euler vector used as the complex-number multiplier signal. The real and imaginary values of the unit Euler vector are drawn from a sine/cosine look-up table (LUT) stored in read-only memory (ROM) addressed by the output of an accumulator used for integrating the error signal. A problem with this phase tracker is that the Hilbert-transform FIR filter has to have many, many taps in order to provide the requisite 90° of phase shift at close to zero frequencies.

Modifications of the HDTV signal radio receiver described above are described and claimed by the inventors in U.S. patent application Ser. No. 08/237,896 filed 4 May 1994 and entitled DIGITAL VSB DETECTOR WITH BANDPASS PHASE TRACKER, AS FOR INCLUSION IN AN HDTV RECEIVER. In the modified HDTV signal radio receiver the second local oscillations, which are heterodyned with the first intermediate frequencies to convert them to second intermediate frequencies, are of a fixed frequency. Accordingly, phase jitter in the AFPC feedback loop of a controlled oscillator is eliminated as a problem in the generation of the second local oscillations. Third local oscillations at a fixed frequency offset from the frequency of the carrier for the second intermediate frequencies are heterodyned with the second intermediate frequencies to downconvert them to third intermediate frequencies, rather than synchrodyning with the second intermediate frequencies to downconvert them to baseband. The third intermediate frequencies are then digitized with a bandpass, rather than baseband, analog-to-digital converter; and the rest of the detection procedures are carried out in the digital regime. The third intermediate frequencies will still exhibit changes in phase error that occur during rapid changes in multipath reception of the HDTV signal, so a phase tracker is still desirable. The phase tracker is implemented at the third intermediate frequencies during complex synchronous detection, and is therefore implemented before equalization filtering, rather than the phase tracker being implemented after complex synchronous detection and equalization filtering as in the prior-art receiver. The phase tracker is a bandpass phase tracker, rather than the baseband (or lowpass) phase tracker used in the prior-art receiver.

The in-phase and quadrature-phase sampling procedures used in the bandpass phase tracker are adapted from ones previously used for complex synchronous detection of digitized bandpass signals having symmetrical sideband structures. HDTV signals for over-the-air broadcasting are vestigial sideband (VSB) amplitude-modulation signals, rather than double sideband (DSB) amplitude-modulation signals, and have asymmetrical sideband structures. The complex synchronous detection of the HDTV signals, used for developing error signal in the bandpass phase tracker, must be sufficiently restricted in bandwidth that response is to a symmetrical sideband structure contained within the asymmetrical sideband structure of the VSB signal. The synchronous detection of the HDTV signals to recover the eight-level (or 16-level) VSB coding is not so restricted in bandwidth.

The in-phase and quadrature-phase sampling procedures used by the inventors in the bandpass phase tracker described in U.S. patent application Ser. No. 08/237,896 are generally similar to those described by D. W. Rice and K. H. Wu in their article "Quadrature Sampling with High Dynamic Range" on pp. 736–739 of IEEE TRANSACTIONS ON AEROSPACE AND ELECTRONIC SYSTEMS, Vol. AES-18, No. 4 (November 1982), for example. Rice and Wu point out that the bandpass signals need to be sampled before digitization at or above the Nyquist rate, as determined by the bandwidth of the bandpass signal and not by the highest frequency component of the bandpass signal. Quadrature-phase synchronous detection is performed using a Hilbert-transform FIR filter on the digitized bandpass signals; in-phase synchronous detection is performed after compensating delay equal to the latency time of the Hilbert-transform FIR filter. Rice and Wu point out that performing complex synchronous detection on digitized bandpass signals has the advantage that the direct components introduced by the mixer are suppressed by the bandpass filter and do not affect digitization. In the complex synchronous detection of digitized VSB signals in bandpass form, the direct component of the complex synchronous detection result arising from the partially suppressed carrier wave is unaffected by the direct components introduced by the mixer, which is important in the inventions disclosed herein. Advantages other than those disclosed by Rice and Wu result from Hilbert transforming digitized bandpass signals, rather than digitized baseband signals. The Hilbert-transform FIR filter no longer has to provide 90° of phase shift at close to zero frequencies, where very long delay is required for providing 90° of phase shift. The Hilbert-transform FIR filter only has to provide 90° of phase shift above a megahertz or two, where delay requirements are modest, up to a frequency of seven to eight megahertz. The relatively small ratio between the uppermost response frequency and the lowermost response frequency required of the filter keeps the number of taps required in the filter relatively low.

In U. S. patent application Ser. No. 08/237,896 the inventors indicated that other embodiments of their invention are possible wherein the in-phase and quadrature-phase sampling procedures used in the bandpass phase tracker are implemented by other types of paired all-pass digital filters that exhibit a constant π/2 difference in phase response for the digitized bandpass signals. C. M. Rader in his article "A Simple Method for Sampling In-Phase and Quadrature Components", IEEE TRANSACTIONS ON AEROSPACE AND ELECTRONIC SYSTEMS, Vol. AES-20, No. 6 (November 1984), pp. 821–824, describes improvements in complex synchronous detection carried out on digitized bandpass signals in which the Hilbert-transform FIR filter and the compensating-delay FIR filter of Rice and Wu are replaced by a pair of all-pass digital filters designed based on Jacobian elliptic functions and exhibiting a constant π/2 difference in phase response for the digitized bandpass signals. A pair of such all-pass digital filters preferred by Rader has the following system functions:

$$H_1(z) = z^{-1}(z^{-2} - a^2)/(1 - a^2 z^{-2}) \quad a^2 = 0.5846832$$

$$H_2(z) = -(z^{-2} - b^2)/(1 - b^2 z^{-2}) \quad b^2 = 0.1380250$$

Rader describes filter configurations which require only two multiplications, one by $a^2$ and one by $b^2$. In U.S. patent application Ser. No. 08/243,480 filed 19 May 1994 and entitled DIGITAL VSB DETECTOR WITH BANDPASS PHASE TRACKER USING RADER FILTERS, AS FOR USE IN AN HDTV RECEIVER the inventors describe further reductions that can be made to the Rader filters.

T. F. S. Ng in United Kingdom patent application 2 244 410 A published 27, Nov. 1991 and entitled QUADRATURE DEMODULATOR criticizes the Rader filters, which are recursive filters of infinite impulse response (IIR) type, for their departures from absolute phase linearity. Ng proposes using non-recursive transversal filters of finite impulse response (FIR) type that have kernels which are symmetrical in terms of amplitude, to achieve absolute phase linearity. Ng advocates the digitization of the final intermediate-frequency signal at a multiple of four times the data symbol transmission rate, so the complex digital filter can be realized as two independent feedforward filter sections, one responsive to oddly occurring digital samples and the other responsive to evenly occurring digital samples. Using Ng filters in place of the Rader filters can reduce variation of symbol timing versus a fixed sampling clock, to reduce the likelihood of intersymbol error, particularly when the digitization of the final IF signal is at a low multiple of four times the data symbol transmission rate, such as four times the data symbol transmission rate.

Digitizing the final IF signal at a sample rate that is four times the data symbol transmission rate and filtering the resulting digital samples with Ng filters results in a real response having a sampling rate twice the data symbol transmission rate and in an imaginary response having a sampling rate twice the data symbol transmission rate. A real response having a sampling rate twice the data symbol transmission rate is required by symbol synchronization circuitry described in U.S. patent application Ser. No. 08/243,480. This symbol synchronization circuitry is of the same general type as S. U. H. Qureshi describes for use with pulse amplitude modulation (PAM) signals in his paper "Timing Recovery for Equalized Partial-Response Systems", IEEE Transactions on Communications, December 1976, pp. 1326–1330.

SUMMARY OF THE INVENTION

The invention is embodied in a radio receiver for receiving VSB signals including symbol codes descriptive of digital signals, HDTV signals being exemplary of such VSB signals. A tuner provides for selecting one of channels at different locations in a frequency band used for transmitting the VSB signals. The tuner also includes mixers for performing plural conversion of the selected channel to a final intermediate-frequency signal, which has lowest frequencies substantially above zero frequency and is digitized by an analog-to-digital converter. A phase tracker, operative on narrow-bandpass filtered portions of the digitized final intermediate-frequency signal centering on its carrier frequency, suppresses an imaginary portion of said final intermediate-frequency signal, arising from multipath distortion or from phase incoherence in local oscillations used during frequency conversion(s). The phase tracker utilizes a pair of all-pass digital filters exhibiting a constant $\pi/2$ difference in phase response for the digitized bandpass signals, of the type described by T. F. S. Ng in United Kingdom patent application 2 244 410 A published 27, Nov. 1991 and entitled QUADRATURE DEMODULATOR or of a corresponding type. A digital controlled oscillator in the phase tracker supplies digital descriptions of the carrier wave for a real portion of the final intermediate-frequency signal to a synchronous detector, which synchronous detector detects the real portion of the digitized final intermediate-frequency signal in accordance with those digital descriptions of the carrier wave.

In the block schematic diagrams clock or control signal connections are shown in dashed line, where it is desired to distinguish them from connections for the signals being controlled.

DETAILED DESCRIPTION

Figure 1:
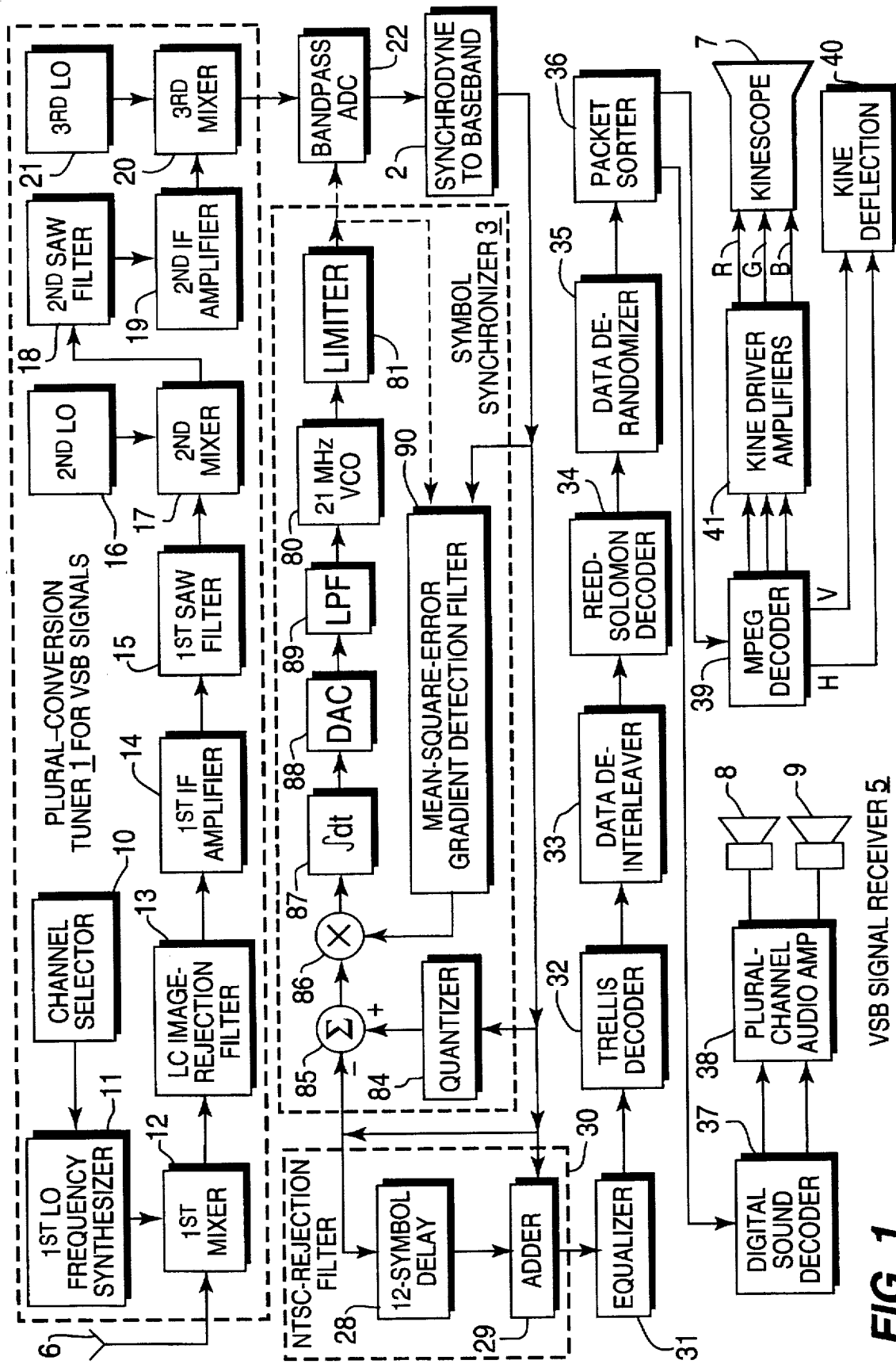
FIG. 1 is a block schematic diagram of a receiver for VSB signal with a pilot carrier component, which receiver uses digital circuitry for synchrodyning symbols to baseband and is of the general type in which the invention may be embodied.

FIG. 1 shows a VSB signal receiver 5 for receiving digital HDTV signals from a broadcast receiving antenna 6. This receiver 5 recovers red (R), green (G) and blue (B) drive signals for a kinescope 7 and recovers stereophonic sound signals for driving left and right loudspeakers 8 and 9. Alternatively, the VSB signal receiver 5 can be connected for receiving digital HDTV signals from a narrowcast receiving antenna or from a cablecast transmission system. A different display device may be used instead of the kinescope 7, and the sound recovery system may be different, consisting of but a single audio channel or being more elaborate than a simple stereophonic reproduction system.

A tuner 1 comprising elements 11–21 selects one of channels at different locations in the frequency band for the received VSB signals, such as the digital HDTV signals captured by the broadcast receiving antenna 6, and performs plural frequency conversion of the selected channel to a final intermediate-frequency signal in a final intermediate-frequency band. More particularly, a channel selector 10 designed for operation by a human being determines the frequency of first local oscillations that a frequency synthesizer 11, which functions as a first local oscillator, furnishes to a first mixer 12 for heterodyning with received signals as supplied from the broadcast receiving antenna 6 or other digital HDTV signal source. The first mixer 12 upconverts the received signals in the selected channel to prescribed first intermediate frequencies and an LC filter 13 is used to reject the unwanted image frequencies that accompany the upconversion result supplied from the first mixer 12. The first intermediate frequencies resulting from the upconversion are supplied as input signal to a first intermediate-frequency amplifier 14, which supplies amplified first intermediate frequencies (e.g., with 920 MHz carrier) for driving a first surface-acoustic-wave (SAW) filter 15. The upconversion to the rather high-frequency first intermediate frequencies facilitates SAW filtering having a large number of poles and zeroes. Second local oscillations from a second local oscillator 16 are supplied to a second mixer 17 for heterodyning with the response of the first SAW filter 15, to generate second intermediate frequencies (e.g., with 41 MHz carrier). A second SAW filter 18 is used for rejecting the unwanted image frequencies that accompany the upconversion result supplied from the second mixer 17. The response of the second SAW filter 18 is supplied as input signal to a second intermediate-frequency amplifier 19, the amplified second intermediate-frequency signal response of which is supplied as input signal to a third mixer 20 there to be heterodyned with oscillations from a third local oscillator 21. The plural-conversion tuner 1 as thus far described resembles those previously proposed by others, except that the frequency of the oscillations from the third local oscillator 21 is chosen such that the third mixer 20 supplies a third intermediate-frequency signal response), rather than a baseband signal with zero-frequency carrier as previously proposed. This third intermediate-frequency signal response is the final intermediate-frequency output signal of the tuner 1. This final-IF output signal may have a 10.5 MHz carrier, for example, with the vestigial sideband above carrier and the full sideband below carrier so as to be better sampled.

An analog-to-digital converter (ADC) 22 samples the final intermediate-frequency output signal of the tuner 1, the duration of each of the analog samples being no longer than a half cycle of the highest final intermediate frequency so as to avoid undesirable aliasing, and digitizes the samples to digital samples having 10-bit resolution, or so. The lowpass filter that is included, per customary practice, in the ADC 22 suppresses the high-frequency image of the third intermediate-frequency signal response from the third mixer 20. The second SAW filter 18 has already restricted the bandwidth of the third intermediate-frequency signals presented to the ADC 22 to be digitized, so the ADC 22 functions as a bandpass analog-to-digital converter for supplying digitized final IF signal to digital circuitry 2 for synchrodyning VSB signals to baseband. The sampling rate used by the ADC 22 during digitization must be at least the Nyquist rate for the third intermediate-frequency signal.

The invention concerns the specific nature of the digital circuitry 2 for synchrodyning to baseband. Various embodiments of this circuitry, which use finite-impulse-response digital filters designed in accordance with the principles taught by T. F. S. Ng in United Kingdom patent application 2 244 410 A published 27, Nov. 1991 and entitled QUADRATURE DEMODULATOR, are shown in FIGS. 2, 3, 4 and 5. The $H_1(z)$ and $H_2(z)$ system functions these FIR digital filters provide are all-pass, and the phase response of the $H_1(z)$ system function leads the phase response of the $H_2(z)$ system function by $\pi/2$ radians across the final intermediate-frequency band. In each of the various embodiments of the invention the digitization of the final intermediate-frequency signal is done by the ADC 22 at four times the data symbol transmission rate, as prescribed by Ng. This permits the complex digital filter to be realized as two independent feedforward filter sections, one responsive to oddly occurring digital samples and the other responsive to evenly occurring digital samples.

In practice the inventors prefer the lowest possible sampling rate of four times the data symbol transmission rate for the VSB HDTV signals or about $42 \cdot 10^6$ samples per second. Since the paired Ng filters respond to oddly occurring digital samples and to evenly occurring digital samples, respectively, the real response and the imaginary response they respectively supply are each sampled at twice the symbol rate for the VSB HDTV signals.

Sampling the real response at twice the symbol rate for the VSB HDTV signals accommodates symbol synchronization circuitry 3 for synchronizing the sampling by the ADC 22 with the symbol rate, so as to maximize the "eye" response, as is pointed out by the inventors in U.S. patent application Ser. No. 08/243,480. The symbol synchronization circuitry 3 is of the specific type described by the inventors in their earlier-filed U.S. patent application entitled DIGITAL VSB DETECTOR WITH BANDPASS PHASE TRACKER, AS FOR INCLUSION IN AN HDTV RECEIVER. The symbol synchronization circuitry 3 is of the same general type as S. U. H. Qureshi describes for use with pulse amplitude modulation (PAM) signals in his paper "Timing Recovery for Equalized Partial-Response Systems", IEEE Transactions on Communications, December 1976, pp. 1326–1330.

A voltage-controlled oscillator 80 generates cissoidal oscillations nominally of 42 MHz frequency. The oscillator 80 is preferably a crystal oscillator capable of frequency control over a relatively narrow range. A symmetrical clipper or limiter 81 generates a squarewave response to these cissoidal oscillations, which is used as clock signal by the ADC 22 as a step in the digitization procedure which follows the initial step of filtering to limit bandwidth. The generation of the error signal for controlling the frequency and phase of the cissoidal oscillations generated by the VCO 80 will now be considered in some detail.

The samples from the digital circuitry 2 for synchrodyning VSB signals to baseband are supplied to a quantizer 84, which supplies the quantization level most closely approximated by the sample currently received by the quantizer 84 as input signal. This quantization level has the quantizer 84 input signal subtracted therefrom by a digital adder/subtractor 85. The difference signal from the subtractor 85 is indicative of the correction required to correct for error in the symbols as detected, but does not indicate whether the error arising from the sampling at the VSB signal receiver 5 being misphased is due to sampling too early or too late in time.

The samples from the digital circuitry 2 for synchrodyning VSB signals to baseband are applied as input signal to a mean-square-error gradient detection filter 90. The filter 90 is a finite-impulse-response digital filter having a $(-\frac{1}{2})$, 1, 0, $(-1)$, $(\frac{1}{2})$ kernel, the operation of which is clocked by the squarewave response generated by the symmetrical clipper or limiter 81. The filter 90 response is in temporal alignment with the difference signal from the subtractor 85. A digital multiplier 86 multiplies the difference signal from the subtractor 85 by the filter 90 response to resolve the issue of whether the error arising from the sampling at the VSB signal receiver 5 being misphased is due to sampling too early or too late in time. The sign bit and the next most significant bit of the two's complement response the filter 90 provides are sufficient for the multiplication, which permits simplification of the digital multiplier 86 structure. The product signal from the digital multiplier 86 is supplied to an accumulator 87 for integration, to generate a digital control signal that is converted to an analog control voltage by a digital-to-analog converter 88. A narrowband lowpass filter 89 is used for applying the analog control voltage to the VCO 80.

The baseband response of the digital circuitry 2 for synchrodyning VSB signals to baseband is applied as input signal to a clocked delay line 28 and as a first summand input signal to a two-input digital adder 29. The clocked delay line 28 supplies a response to its input signal after a delay equal to twelve symbol epochs, which delayed response is applied to the digital adder 29 as its second summand input signal. The clocked delay line 28 and the digital adder 29 cooperate to provide an NTSC-rejection filter 30 for suppressing co-channel interference from NTSC signals. The NTSC-rejection filter 30, which is a comb filter, is required as long as NTSC signals are being transmitted over the same channel allocations as digital HDTV signals. The filter 30 suppresses the NTSC luminance carrier and its lower-frequency sidebands containing synchronizing information, very strongly rejects the color subcarrier, suppresses the chrominance sidebands, and suppresses the FM audio carrier. The filter 30 supplies a fifteen-coding-level signal to an equalizer 31 in response to the eight-coding-level digital in-phase synchronous detection result from the detector 23. Though not explicitly shown, the input signal to the equalization filter 31 is decimated 2:1 to reduce sample rate to symbol rate. The equalization filter response is supplied from the equalizer 31 as input signal to a trellis decoder 32, which performs the symbol decoding that recovers the digital data stream. The equalizer 31 provides equalization filtering that generates an adjusted amplitude response to the plural-level coding as applied to the trellis decoder 32, which adjusted amplitude response minimizes symbol error resulting from inter-symbol interference. The phase-linearity of the Ng filters used in the digital circuitry 2 for synchrodyning VSB signals to baseband reduces phase distortion with symbol changes to avoid subsequent introduction of inter-symbol interference.

Although not explicitly shown in FIG. 1, preferably circuitry is provided in the VSB signal receiver 5 to sense when there is co-channel interference from NTSC signal, to by-pass the filter 30 when no co-channel interference from NTSC signal is sensed, and to adjust symbol decoding ranges in accordance with the number of coding levels to be expected. There is less likelihood of the occurrence of erroneous decisions as to symbol identity when eight coding levels have to be discerned than when fifteen coding levels have to be discerned. Although data synchronization circuitry is not explicitly shown in FIG. 1, one skilled in the digital HDTV art will understand that the VSB signal receiver 5 includes circuitry for determining when data fields and data lines occur to provide the basis for timing data de-interleaving. Data field synchronization circuitry takes its input signal from the output port of the equalizer 31, supposing the equalizer 31 is of the type preferred by the inventors, which type makes feedback adjustments of amplitude response dependent on the response of the equalizer 31 to a ghost-cancellation reference signal. The beginning of data fields are signaled by a pseudo-random pulse train that serves as a ghost-cancellation reference signal for the equalizer 31. Data line synchronization circuitry that detects the occurrences of the symbol code sequence signaling the beginning of data lines as they occur in the equalizer 31 response, rather than as they occur in the equalizer 31 input signal, is preferred by the inventors. Such data line synchronization circuitry can use the same circuitry for deciding coding levels that the trellis decoder 32 uses for symbol decoding.

The data response of the trellis decoder 32 is supplied as input signal to a data de-interleaver 33, and the de-interleaved data are supplied from the data de-interleaver 33 to a Reed-Solomon decoder 34. Error-corrected data are supplied from the Reed-Solomon decoder 34 to a data de-randomizer 35 which regenerates packets of data for a packet sorter 36. The packet sorter 36 sorts packets of data for different applications, responsive to header codes in the successive packets of data. Packets of data descriptive of the audio portions of the HDTV program are applied by the packet sorter 36 to a digital sound decoder 37. The digital sound decoder 37 supplies left-channel and right-channel stereophonic sound signals to a plural-channel audio amplifier 38 that drives the plurality of loudspeakers 8, 9. Packets of data descriptive of the video portions of the HDTV program are applied by the packet sorter 36 to an MPEG decoder 39. The MPEG decoder 39 supplies horizontal (H) and vertical (V) synchronizing signals to kinescope deflection circuitry 40 that provides for the raster scanning of the viewing screen of the kinescope 7 or other display device. The MPEG decoder 39 also supplies signals to the kinescope driver amplifiers 41 for applying amplified red (R), green (G) and blue (B) drive signals to the kinescope 7 or other display device.

Figure 2:
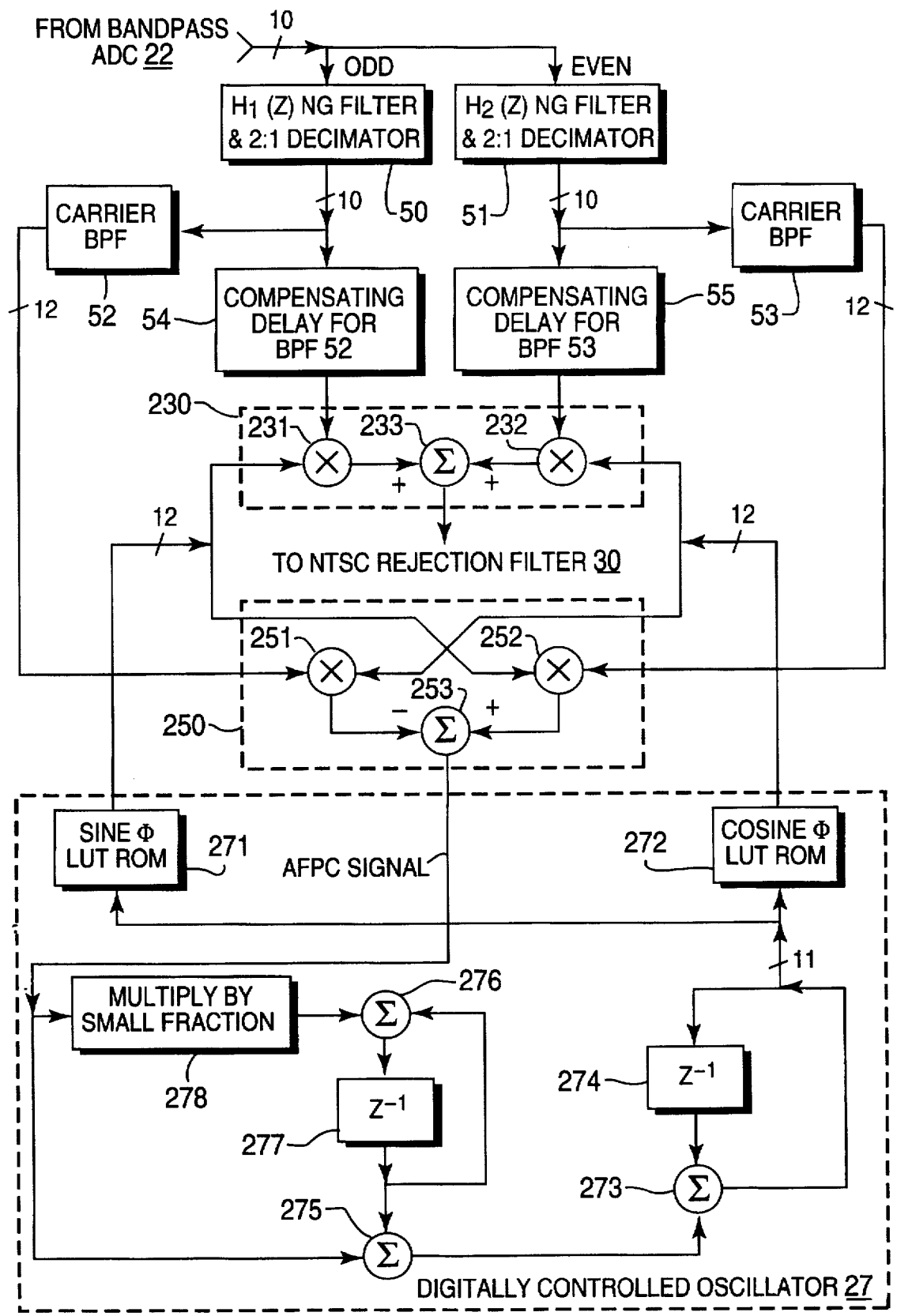
FIGS. 2, 3, 4, and 5 are block schematic diagrams of different configurations that the digital circuitry for synchrodyning symbols to baseband takes in the FIG. 1 VSB receiver in various specific embodiments of the invention.

FIG. 2 shows digital circuitry for synchrodyning VSB signals to baseband in which the digitized final IF signal from the analog-to-digital converter 22 is supplied as input signal to FIR digital filters 50 and 51 of the type described by T. F. S. Ng, which respectively provide the $H_1(z)$ and $H_2(z)$ all-pass system functions exhibiting a constant $\pi/2$ difference in phase response for the digitized bandpass signals. The final IF signal is digitized at four times the data symbol transmission rate for the VSB HDTV signals or about $42 \cdot 10^6$ samples per second. Odd samples of the output signal of the ADC 22 are received as input signal by the filter 50, thus effecting a 2:1 decimation of sample rate in the filter 50 real response. Even samples of the output signal of the ADC 22 are received as input signal by the filter 51, thus effecting a 2:1 decimation of sample rate in the filter 51 real response.

The responses of the digital filters 50 and 51 are supplied as input signals to carrier bandpass filters 52 and 53, respectively. The filters 52 and 53, which have identical bandpass characteristics, separate the complex pilot carrier wave from the sidebands of the carrier wave modulated in accordance with the 8-level VSB coding in the complex signal formed by the responses of the digital filters 50 and 51. The responses of the digital filters 50 and 51 are supplied as input signals to digital delay lines 54 and 55, which provide respective compensating delays equal to the latency times of carrier bandpass filters 52 and 53, respectively.

An in-phase synchronous detector 230 for the complex signal supplied from the digital delay lines 54 and 55 comprises digital multipliers 231 and 232 for multiplying the responses supplied from the delay lines 54 and 55 by the sine and the cosine of the carrier wave, respectively, and a digital adder 233 for summing the product signals from the digital multipliers 231 and 232. Since it is known in advance that the imaginary term of the complex product will invariably be zero-valued, or substantially so, the digital multipliers and subtractor that would be required to generate the imaginary term are dispensed with. The in-phase synchronous detector 230 output signal, which is supplied as the sum signal from the adder 233, is applied to the NTSC-rejection filter 26 as its input signal.

A quadrature-phase synchronous detector 250 includes comprises digital multipliers 251 and 252 for multiplying the responses of the carrier bandpass filters 52 and 53 by the cosine and the sine of the carrier wave, respectively, and a digital subtractor 253 for subtracting the product signal of the digital multiplier 251 from the product signal of the digital multiplier 252. That is, the complex digital description of separated pilot carrier wave furnished by the carrier bandpass filters 52 and 53 is multiplied by the complex digital description of the quadrature-phase carrier wave. Since it is known in advance that the real term of the complex product will invariably be zero-valued, or substantially so, the digital multipliers and adder that would be required to generate the real term are dispensed with. The difference output signal from the subtractor 253 provides an AFPC signal to the DCO 27.

The digital controlled oscillator 27 shown in FIG. 2 comprises a carrier wave sine $\Phi$ look-up table in read-only memory 271 for supplying 12-bit multiplicands to the digital multipliers 231 and 252, a carrier wave cosine $\Phi$ look-up table in read-only memory 272 for supplying 12-bit multiplicands to the digital multipliers 232 and 251, and a ROM address generator for the ROMs 271 and 272. This address generator includes a two-input digital adder 273 supplying the ROM addresses to the ROMs 271 and 272 as its sum output signal and a clocked one-sample delay element 274 for applying that sum output signal to a first summand input of the adder 273 to complete an accumulator for the ROM addresses. A two-input digital adder 275 supplies its sum output signal to the second summand input of the adder 273 for incrementing the ROM address accumulation each system clock cycle. The plural-conversion tuner 1 preferably heterodynes the carrier of the VSB signal to the lower-frequency portion of the band of final IF signal frequencies supplied to the ADC 22, rather than the higher-frequency portion of that band, because the sine $\Phi$ and cosine $\Phi$ multiplicands are then supplied from the ROMs 271 and 272 with a greater number of samples per $2\pi$ radians of $\Phi$, which provides higher angular resolution in the consecutive carrier wave samples.

In the absence of error in the oscillations of the DCO 27, as supplied in quadrature-related phasings from the ROMs 271 and 272, the sum output signal from the subtractor 253 that is supplied as AFPC error signal will be zero-valued. The sum output signal from the subtractor 253 is supplied to a first summand input of the adder 275, but being zero-valued will have no effect on the sum output signal from the adder 275. The sum output signal from the adder 275 will be the same as the signal supplied to its second summand input, which is the sum output signal from another digital adder 276 as delayed by one sample by a clocked one-sample delay element 277. The sum output signal from the subtractor 253 is supplied to a digital multiplier 278 as multiplier input signal to multiply a fixed multiplicand, which multiplier input signal being zero causes the product output signal from the digital multiplier 278 to be zero-valued as well. The product output signal from the digital multiplier 278 is supplied to a first summand input of the adder 276, but being zero-valued will have no effect on the sum output signal from the adder 276. The sum output signal from the adder 276 will be the same as the signal supplied to its second summand input, which is the previous-sample value of the sum output signal from the adder 276 as delayed one sample by the clocked one-sample delay element 277. The loop connection of the adder 276 and the clocked one-sample delay element 277 form a circulating-delay-line memory that continues to supply the same increment to the second summand input of the adder 275 and thence to the second summand input of the adder 273, system clock cycle after system clock cycle, as long as the AFPC signal from the sum output of the adder 253 remains zero-valued. The ROM addresses from the sum output of the adder 273 will continuously ramp up in value until overflow occurs to restart the cycle of continuously ramping up those ROM addresses.

When the AFPC signal from the sum output of the adder 253 is positive in value, this is indicative that the oscillations of the DCO 27, as supplied in quadrature-related phasings from the ROMs 271 and 272, are retarded in phase from proper value. The positive AFPC signal is applied to the first summand input of the adder 275, causing its sum output signal to be increased in value from its value when the AFPC signal is zero-valued. This immediately advances, or sets ahead, the point from which the ROM addresses supplied from the sum output of adder 273 ramp up, which ramping up continues to occur owing to the addresses being fed back to the first summand input of the adder 273 through the single-sample delay element 274. The positive AFPC signal is applied as multiplier input signal to the digital multiplier 278 to multiply the fixed multiplicand, which fixed multiplicand is a small fraction, so a small positive product output signal is generated by the digital multiplier 278 for application to the first summand input of the adder 276. This first summand input signal of small value increases the sum output signal from the adder 276, increasing the size of the increment that is stored in the circulating-delay-line memory formed by the loop connection of the adder 276 and the clocked one-sample delay element 277. This larger increment is applied by the clocked one-sample delay element 277 after one sample delay to the second summand input of the adder 275 and thence to the second summand input of the adder 273. This increased increment speeds the rate of address accumulation by the adder 273 and the single-sample delay element 274 feeding back the sum output signal of that adder to its first summand input. The ROM addresses from the sum output of the adder 273 will continuously ramp up in value until overflow occurs to restart the cycle of continuously ramping up those ROM addresses, the ramping up occurring at the increased rate of accumulation until further non-zero value of the AFPC signal further alters the rate of address accumulation.

When the AFPC signal from the sum output of the adder 253 is negative in value, this is indicative that the oscillations of the DCO 27, as supplied in quadrature-related phasings from the ROMs 271 and 272, are advanced in phase from proper value. The negative AFPC signal is applied to the first summand input of the adder 275, causing its sum output signal to be increased in value from its value when the AFPC signal is zero-valued. This immediately retards, or sets back, the point from which the ROM addresses supplied from the sum output of adder 273 ramp up, which ramping up continues to occur owing to the addresses being fed back to the first summand input of the adder 273 through the single-sample delay element 274. The negative AFPC signal is applied as multiplier input signal to the digital multiplier 278 to multiply the fixed multiplicand, which fixed multiplicand is a small fraction, so a small negative product output signal is generated by the digital multiplier 278 for application to the first summand input of the adder 276. This first summand input signal of small value decreases the sum output signal from the adder 276, decreasing the size of the increment that is stored in the circulating-delay-line memory formed by the loop connection of the adder 276 and the clocked one-sample delay element 277. This smaller increment is applied by the clocked one-sample delay element 277 after one sample delay to the second summand input of the adder 275 and thence to the second summand input of the adder 273. This decreased increment slows the rate of address accumulation by the adder 273 and the single-sample delay element 274 feeding back the sum output signal of that adder to its first summand input. The ROM addresses from the sum output of the adder 273 will continuously ramp up in value until overflow occurs to restart the cycle of continuously ramping up those ROM addresses, the ramping up occurring at the decreased rate of accumulation until further non-zero value of the AFPC signal further alters the rate of address accumulation.

Figure 3:
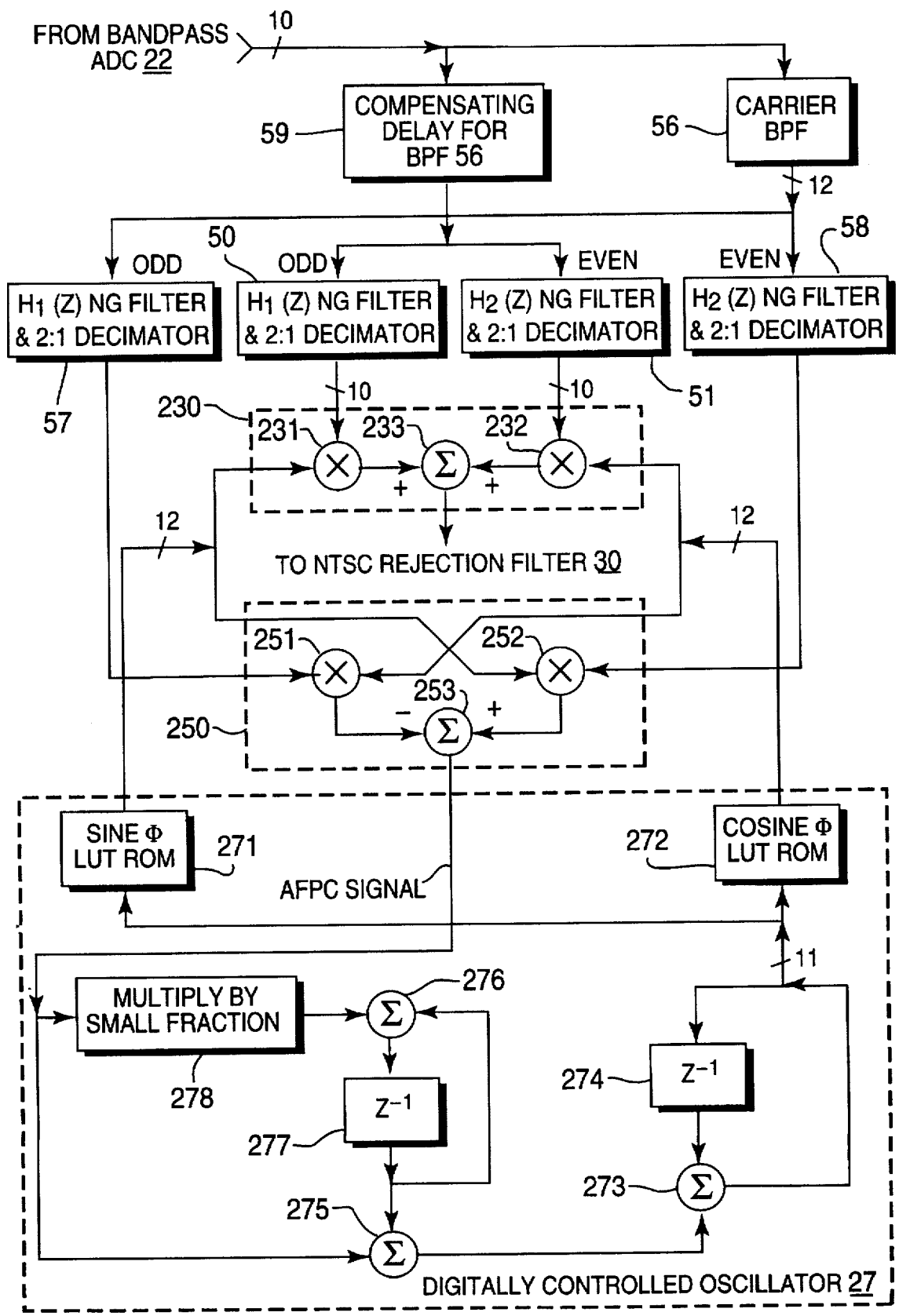

FIG. 3 shows digital circuitry for synchrodyning VSB signals to baseband in another embodiment of the invention, which differs from the FIG. 2 circuitry in the following respects. The narrowband carrier bandpass filters 52 and 53 are dispensed with, in favor of a single narrowband carrier bandpass filter 56 receiving the digitized final IF signal from the ADC 22 as its input signal and selecting a digitized carrier wave therefrom for its response. Odd samples of the filter 56 response are supplied as input signal to an FIR digital filter 57 of the type described by T. F. S. Ng for providing the $H_1(z)$ system function, for convolution with the filter 56 response. Even samples of the filter 56 response are supplied as input signal to an FIR digital filter 58, of the type described by T. F. S. Ng for providing the $H_2(z)$ system function, for convolution with the filter 56 response. The $H_1(z)$ and $H_2(z)$ all-pass system functions exhibit a constant $\pi/2$ difference in phase response for the digitized bandpass signals. The responses of the digital filters 57 and 58 are supplied at a sample rate decimated 2:1 respective to the sample rate used by the ADO 22 and the narrowband carrier bandpass filter 56. The connections to the quadrature-phase synchronous detector 250 are altered so that the digital multipliers 251 and 252 multiply the responses of the digital filters 57 and 58, respectively, rather than the responses of the carrier bandpass filters 52 and 53.

A delayed response to the digitized final IF signal from ADC 22, which delayed response is supplied by a digital delay line 59, is applied as input signal to the FIR digital filters 50 and 51. The responses of the FIR digital filters 50 and 51 are applied directly to the digital multiplier 231 and to the digital multiplier 232 as their respective multiplicand signals. The digital delay line 59 provides compensating delay for the latency of the carrier bandpass filter 56 in the responses of both the filters 50 and 51. The single delay line 59 in cascade connection before the filters 50 and 51 provides the same responses as the two delay lines 54 and 55 connected in respective cascade connections after the filters 50 and 51 do in FIG. 2.

The narrowness of the frequency band over which a constant π/2 difference in phase response needs to be exhibited by the digital filters 57 and 58 may permit them in some designs to be of simpler construction than the digital filters 50 and 51.

Figure 4:
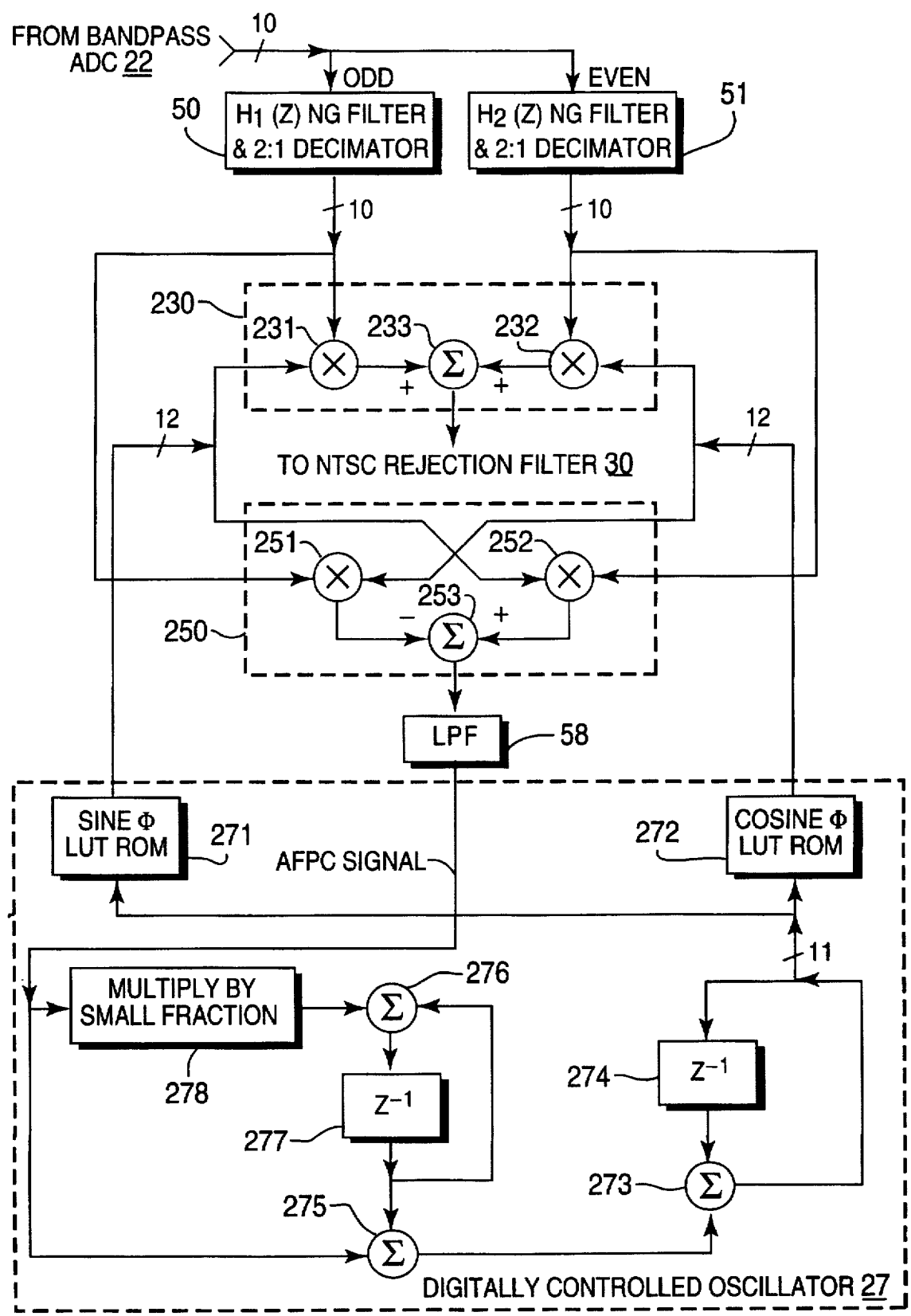

FIG. 4 shows still other digital circuitry for synchrodyning VSB signals to baseband in another embodiment of the invention, which differs from the FIG. 2 circuitry in the following respects. The carrier bandpass filters 52 and 53 are each replaced by a respective wired connection. The digital delay lines 54 and 55, which provide respective compensating delays equal to the latency times of carrier bandpass filters 52 and 53 in FIG. 2, are each replaced by a respective wired connection. The quadrature-phase synchronous detector 250 is operated relatively wideband, with the AFPC signal attributable to the carrier wave being heterodyned to zero or close-to-zero frequency being selected from the sum output signal of the adder 253 using a low-pass digital filter 58. The low-pass filter 58 is chosen to have a cut-off frequency many times lower than symbol rate, so that frequencies associated with groups of successive similar symbols are rejected. The randomization of data as a preliminary step before symbol coding at the transmitter limits the number of successive similar symbols likely to occur, which facilitates lowpass filtering after quadrature-phase synchronous detection to recover AFPC signal. The randomization of data also facilitates bandpass filtering before quadrature-phase synchronous detection to recover AFPC signal per FIG. 2 or 3.

A straightforward variant of the DCO 27 shown in FIGS. 2, 3, and 4 is a DCO in which the two-input adders 273 and 275 are replaced by a single three-input digital adder. A number of tricks relying on symmetries in the sine and cosine functions are known to skilled digital designers for reducing the amount of ROM required for sine Φ and cosine Φ table look-up, and the DCO 27 can be modified to use such reduced-ROM designs. Arrangements where the sine Φ and cosine Φ signals are not read from ROM, but rather are accumulated in parallel in accordance with the sin (A+B)= sin A cos B+cos A sin B and cos (A+B)=cos A cos B−sin A sin B trigonometric formulae are another DCO arrangement that can be used in modifications of the DCO 27 in further embodiments of the invention.

Figure 5:
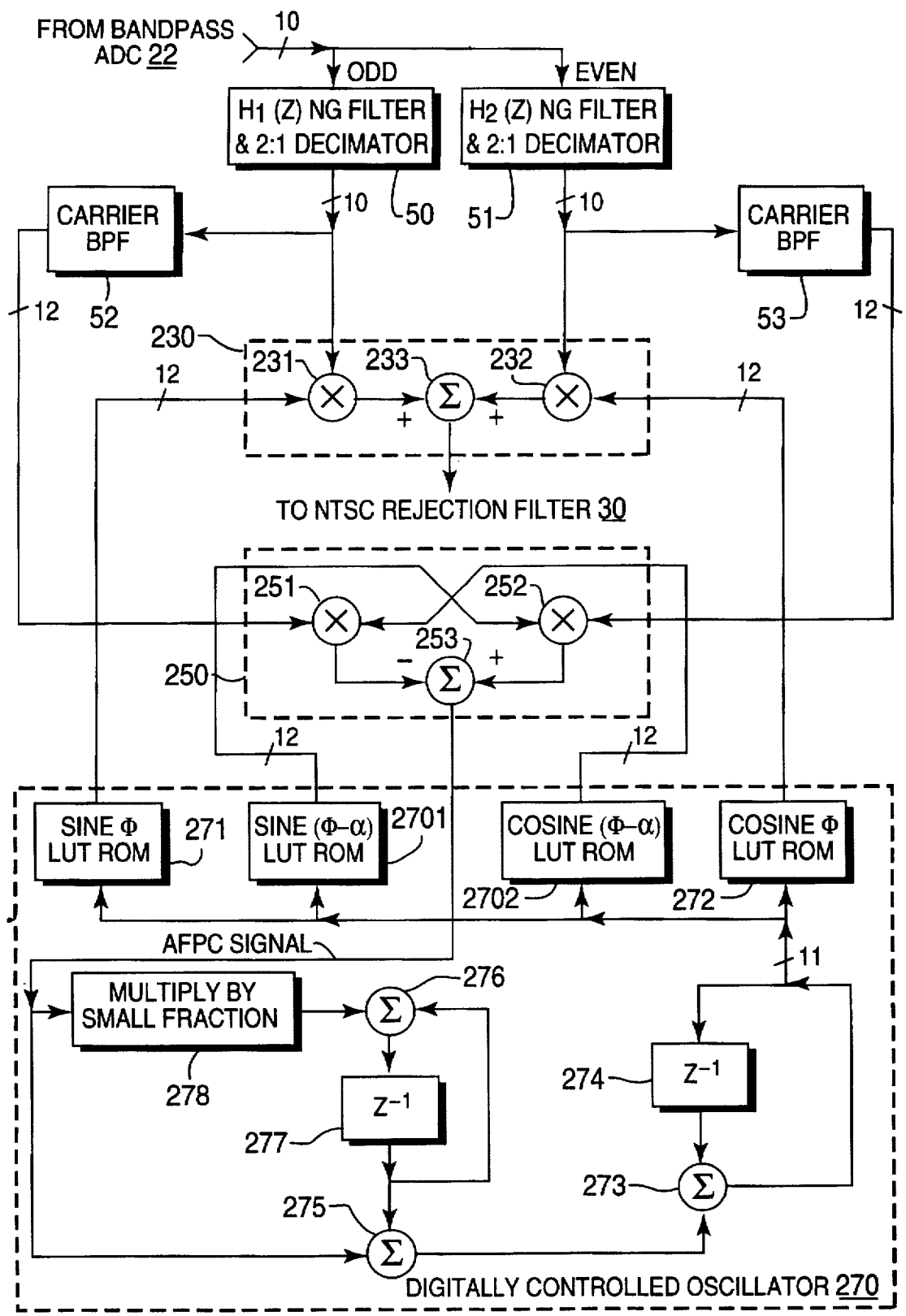

FIG. 5 shows a variant of the digital circuitry for synchrodyning VSB signals to baseband shown in FIGS. 2 and 3, which variant uses a DCO 270 that differs from the DCO 27 in that it further includes a read-only memory 2701 storing a sin (Φ-α) look-up table and a read-only memory 2702 storing a cos (Φ-α) look-up table. The digital multiplier 252 receives its multiplier signal from the ROM 2701, rather than from the ROM 271; and the digital multiplier 251 receives its multiplier signal from the ROM 2702, rather than from the ROM 272. The digitized final IF signal from the ADC 22 is applied, via a wired connection without substantial delay, as input signal to the filter 50; and the response of the filter 50 is applied, via wired connection without substantial delay, to the digital multiplier 231 as its multiplicand input signal. The digitized final IF signal from the ADC 22 is applied, via a wired connection without substantial delay, as input signal to the filter 51; and the response of the filter 51 is applied, via a wired connection without substantial delay, to the digital multiplier 231 as its multiplicand input signal. In special cases where α is 90°, the ROMs 2701 and 2702 are not required, of course, since the cos (Φ-α) and sin (Φ-α) values are respectively the sin Φ value as read from the ROM 271 and the negative of the cos Φ value as read from the ROM 272.

Although the radio receivers specifically described above for receiving VSB signals including symbol codes descriptive of digital signals use the triple-conversion tuner 1 for developing a third intermediate-frequency signal, as the final intermediate-frequency signal which is subjected to complex synchronous detection, receivers using double-conversion tuners and a bandpass phase tracker of a nature as described above embody the invention in its broader aspects. Radio receivers using only a double-conversion tuner are possible, in which the second intermediate-frequency signal is the final intermediate-frequency signal and is in the same frequency range as the final intermediate-frequency signal of the triple-conversion tuner 1. It is also possible to construct a double-conversion tuner that converts the selected HDTV channel directly to the 30–45 MHz range and then converts the resulting first immediate frequency signal to a final intermediate frequency in the 1–8 MHz range. An AGC range of 60–90 dB is required of the tuner, requiring a plurality of controlled-gain intermediate-frequency amplifier stages. Maintaining phase linearity over a wide range of controlled gain is more easily achieved at frequencies higher than the 1–8 MHz range. So, when the final IF signal is chosen to be in the 1–8 MHz range, it is preferable that the IF amplifiers before the final mixer provide the required AGC range of 60–90 dB. Providing this controlled gain at two frequencies better avoids unwanted regeneration effects, which tend to occur in a high-gain amplifier operating in a single frequency band. The high degree of phase-linearity required of the SAW filtering is easier to achieve at intermediate frequencies higher than the 30–40 MHz range. Accordingly, a triple-conversion tuner is currently preferred.

Figure 6:
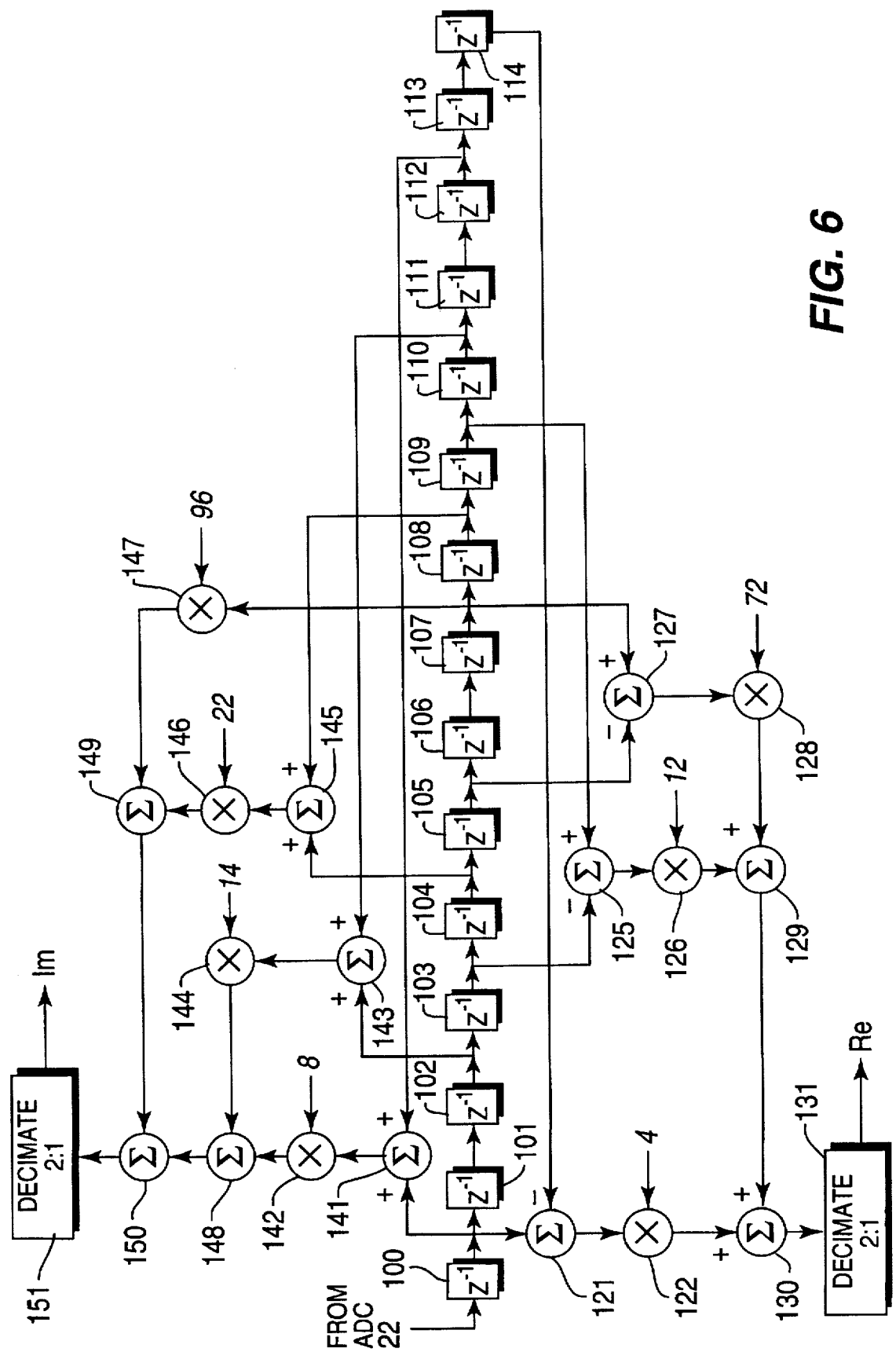
FIG. 6 is a block schematic diagram of a modification that is preferably made to each of the configurations shown in FIGS. 2, 3, 4, and 5 wherein each Ng complex filter is replaced by a complex filter in which 2:1 decimation is carried out subsequent to complex filtering, rather than before complex filtering.

FIG. 6 is a detailed block schematic diagram of a complex-signal filter developing a constant π/2 difference in phase between a real response Re and an imaginary response Im to the digitized bandpass signals, that in preferred embodiments of the invention replaces the complex-signal filter described by T. F. S. Ng in United Kingdom patent application 2 244 410 A published 27, Nov. 1991 and entitled QUADRATURE DEMODULATOR. The filters 50 and 51 of FIG. 2, 3, 4 or 5 can be constructed like the FIG. 6 filter. So can the filters 57 and 58 of FIG. 3. The FIG. 6 complex-signal filter differs from the filters described by Ng in that 2:1 decimation is done following filtering, rather than before.

This permits the real and imaginary filtering to be supported by a shared tapped delay line. FIG. 6 shows this shared tapped delay line composed of cascaded single-clock-delay elements 100–114, such as latches that like the ADC 22 are clocked at four times symbol transmission rate. The single-clock-delay element 100 may be dispensed with or subsumed into the ADC 22 in some designs. Digital adders and subtractors in the FIG. 6 complex filter are assumed to be clocked at four times symbol transmission rate, with each having a single-clock-duration latency. The digital multipliers are assumed to be provided from read-only memory (ROM) or, in the case of a multiplication by an integral power of two, to be provided by a wired place shift. So, there is zero latency in each of the multiplications insofar as clocked operation is concerned. At least the eight-bit resolution in the filter results proposed by Ng is presumed. Placing the carrier of the final-IF output signal at 10.5 MHz makes it the same as the symbol transmission rate, as in the example described by Ng.

In order to generate the real response $H_1(z)$, the real-response filter is presumed to apply tap weights $W_0=4$, $W_1=0$, $W_2=-12$, $W_3=-72$, $W_4=72$, $W_5=12$, $W_6=0$ and $W_7=-4$ per the example described by Ng. The real-response filter, in addition to the single-clock-delay elements 100–114, includes a digital subtractor 121 for subtracting the response of the delay element 114 from the response of the delay element 100, a digital multiplier 122 for weighting the differential response of the subtractor 121 by a factor of four, a digital subtractor 125 for subtracting the response of the delay element 103 from the response of the delay element 109, a digital multiplier 126 for weighting the differential response of the subtractor 125 by a factor of twelve, a digital subtractor 127 for subtracting the response of the delay element 105 from the response of the delay element 107, a digital multiplier 128 for weighting the differential response of the subtractor 127 by a factor of seventy-two, a digital adder 129 for summing the products from the digital multipliers 126 and 128, a digital adder 130 for summing the product from the digital multiplier 122 with the sum output signal from the adder 129, and a 2:1 decimator 131 for generating the real filter response Re in decimated response to the sum output signal from the adder 130.

The subtractor 121 subtracts the response of the delay element 114 from the response of the delay element 100, rather than subtracting the response of the delay element 113 from the output signal of the ADC 22, to introduce single-clock-duration delay to compensate for the latency of the adder 129. Since $W_1=0$ and $W_6=0$, there is no digital subtractor 123 for subtracting the response of the delay element 111 from the response of the delay element 101 or digital multiplier 124 for weighting the differential response of the subtractor 123. Consequently, there is no digital adder for summing product from the multiplier 124 with the product from the multiplier 122. This gives rise to the need to compensate for the latency of the adder 129.

In order to generate the imaginary response $H_1(z)$, the imaginary-response filter is presumed to apply tap weights $W_8=8$, $W_9=14$, $W_{10}=22$, $W_{11}=96$, $W_{12}=22$, $W_{13}=14$, $W_{14}=8$ corrected from the example described by Ng. The imaginary-response filter, in addition to the single-clock-delay elements 100–112, includes a digital adder 141 for adding the response of the delay element 112 with the response of the delay element 100, a digital multiplier 142 for weighting the sum response of the adder 141 by a factor of eight, a digital adder 143 for adding the response of the delay element 110 with the response of the delay element 102, a digital multiplier 144 for weighting the sum response of the adder 143 by a factor of fourteen, a digital adder 145 for adding the response of the delay element 108 with the response of the delay element 104, a digital multiplier 146 for weighting the sum response of the adder 145 by a factor of twenty-two, a digital multiplier 147 for weighting the response of the delay element 107 by a factor of ninety-six, a digital adder 148 for summing the products from the digital multipliers 142 and 144, a digital adder 149 for summing the products from the digital multipliers 146 and 147, a digital adder 150 for summing the sum output signals from the adders 148 and 149, and a 2:1 decimator 151 for generating the imaginary filter response Im in decimated response to the sum output signal from the adder 150.

The digital multiplier 147 weights the response of the delay element 107 by a factor of ninety-six, rather than the response of the delay element 106, in order to introduce single-clock-duration delay to compensate for the single-clock-duration latency of each of the adders 141, 143 and 145.

Various equivalents of the FIG. 6 complex filter are possible, owing to the commutative and associative properties of signed multiplication and signed addition, as one skilled in the art of digital filter design will appreciate; and this should be borne in mind when construing the scope of the claims which follow.

What is claimed is:

1. A radio receiver for digital television signals transmitted at a prescribed symbol transmission rate, said radio receiver comprising a tuner for selecting one of channels at different locations in a frequency band and frequency converting the selected channel to a final intermediate-frequency signal in a final intermediate-frequency band;

an analog-to-digital converter for digitizing said final intermediate-frequency signal at a sample rate that is four times said symbol transmission rate, to generate as an output signal thereof digitized final intermediate-frequency signal; and digital circuitry for synchrodyning said digitized final intermediate-frequency signal to baseband, which said digital circuitry comprises:

a digitally controlled oscillator for generating digitized samples of a cosine wave of a controlled frequency and digitized samples of a sine wave of said controlled frequency, said controlled frequency being controllable over a range of frequencies including the carrier frequency of said final intermediate-frequency signal in response to a digital control signal indicative of the difference of said controlled frequency from a desired frequency;

a first finite-impulse-response digital filter generating a first digital filter response to frequencies throughout said final intermediate-frequency band, said first digital filter response being a linear-phase real response;

a second finite-impulse-response digital filter generating a second digital filter response to frequencies throughout said final intermediate-frequency band, said second digital filter response being a linear-phase imaginary response;

means for applying said digitized final intermediate-frequency signal to said first and second digital filters as a shared input signal to each of them;

a first digital multiplier, receptive of the digitized samples of said cosine wave of said controlled frequency as its multiplier signal, for generating a first product signal;

means for applying said first digital filter response to said first digital multiplier as its multiplicand signal;

a second digital multiplier, receptive of the digitized samples of said sine wave of said controlled frequency as its multiplier signal, for generating a second product signal;

means for applying said second digital filter response to said second digital multiplier as its multiplicand signal; and a first digital adder additively combining said first and second product signals for generating a first sum signal supplied as an output signal from said digital circuitry for synchrodyning said digitized final intermediate-frequency signal to baseband.

2. A radio receiver as set forth in claim 1, wherein said digital circuitry for synchrodyning said digitized final intermediate-frequency signal to baseband further comprises:

finite-impulse-response, narrow-bandpass, third and fourth digital filters having identical response functions centering on the carrier frequency of said final intermediate-frequency signal, each of which said third and fourth digital filters exhibits a respective similar latency time, said third digital filter in cascade connection after said first digital filter for providing a frequency-selective response to the real linear-phase response of said first digital filter, said fourth digital filter in cascade connection after said second digital filter for providing a frequency-selective response to the imaginary linear-phase response of said second digital filter;

a third digital multiplier, receptive of the frequency-selective response of said third digital filter as its multiplicand signal and receptive of the digitized samples of said cosine wave of said controlled frequency as its multiplier signal, for generating a third product signal;

a fourth digital multiplier, receptive of the frequency-selective response of said fourth digital filter as its multiplicand signal and receptive of the digitized samples of said sine wave of said controlled frequency as its multiplier signal, for generating a fourth product signal;

a digital subtractor differentially combining said third and fourth product signals for generating a difference signal indicative of the departure of the frequency and phase of said controlled frequency from the carrier frequency of said final intermediate-frequency signal; and means responsive to said difference signal for supplying said digital control signal to said digital controlled oscillator; wherein said means for applying said first digital filter response to said first digital multiplier as its multiplicand signal comprises a first digital delay line for delaying, by a delay equal to the latency time of said third digital filter, said first digital filter response as applied to said first digital multiplier as its multiplicand signal; and wherein said means for applying said second digital filter response to said second digital multiplier as its multiplicand signal comprises a second digital delay line for delaying, by a delay equal to the latency time of said fourth digital filter, said second digital filter response as applied to said second digital multiplier as its multiplicand signal.

3. A radio receiver as set forth in claim 2, further comprising:

a plurality of successive intermediate-frequency amplifier stages included within said tuner, at least one of which intermediate-frequency amplifier stages provides gain at an intermediate frequency different from said final intermediate-frequency band, at least two of which intermediate-frequency amplifier stages provide gain each in an amount controlled by a respective gain control signal;

means for applying said respective gain control signals, in respective amounts each controlled by an automatic gain control input signal;

a fifth digital multiplier, receptive of the frequency-selective response of said third digital filter as its multiplicand signal and receptive of the digitized samples of said sine wave of said controlled frequency as its multiplier signal, for generating a fifth product signal;

a sixth digital multiplier, receptive of the frequency-selective response of said fourth digital filter as its multiplicand signal and receptive of the digitized samples of said cosine wave of said controlled frequency as its multiplier signal, for generating a sixth product signal;

a second digital adder additively combining said fifth and sixth product signals for generating a second sum signal;

means for generating an analog lowpass filtered response to said second sum signal; and means for supplying said analog lowpass filtered response, at least under selected conditions, to said means for applying said respective gain control signals as said automatic gain control input signal.

4. A radio receiver as set forth in claim 3 wherein said means for applying said respective gain control signals includes an AGC delay network responsive to said automatic gain control input signal for applying said respective gain control signals.

5. A radio receiver as set forth in claim 4 wherein said means for supplying said analog lowpass filtered response, at least under selected conditions, to said means for applying said respective gain control signals as said automatic gain control input signal is of a type that supplies said analog lowpass filtered response under any and all conditions to said AGC delay network responsive as said automatic gain control input signal.

6. A radio receiver as set forth in claim 4 wherein said means for supplying said analog lowpass filtered response, at least under selected conditions, to said means for applying said respective gain control signals as said automatic gain control input signal comprises:

an analog-OR circuit receiving said analog lowpass filtered response as one of plural input signals thereto and supplying said automatic gain control input signal to said means for applying said respective gain control signals.

7. A radio receiver as set forth in claim 2, including:

a plurality of successive intermediate-frequency amplifier stages included within said tuner, at least one of which intermediate-frequency amplifier stages provides gain at an intermediate frequency different from said final intermediate-frequency band, at least two of which intermediate-frequency amplifier stages provide gain each in an amount controlled by a respective gain control signal;

means for applying said respective gain control signals, in respective amounts each controlled by an automatic gain control input signal;

means for generating an analog lowpass filtered response to said first sum signal; and means for supplying said analog lowpass filtered response, at least under selected conditions, to said means for applying said respective gain control signals as said automatic gain control input signal.

8. A radio receiver as set forth in claim 7 wherein said means for applying said respective gain control signals includes an AGC delay network responsive to said automatic gain control input signal for applying said respective gain control signals.

9. A radio receiver as set forth in claim 8 wherein said means for supplying said analog lowpass filtered response, at least under selected conditions, to said means for applying said respective gain control signals as said automatic gain control input signal is of a type that supplies said analog lowpass filtered response under any and all conditions to said AGC delay network responsive as said automatic gain control input signal.

10. A radio receiver as set forth in claim 8 wherein said means for supplying said analog lowpass filtered response, at least under selected conditions, to said means for applying said respective gain control signals as said automatic gain control input signal comprises:

an analog-OR circuit receiving said analog lowpass filtered response as one of plural input signals thereto and supplying said automatic gain control input signal to said means for applying said respective gain control signals.

11. A radio receiver as set forth in claim 1, wherein said digital circuitry for synchrodyning said digitized final intermediate-frequency signal to baseband further comprises:

a third finite-impulse-response digital filter generating a third digital filter response to frequencies throughout said final intermediate-frequency band, said third digital filter response being a linear-phase real response;

a fourth finite-impulse-response digital filter generating a fourth digital filter response to frequencies throughout said final intermediate-frequency band, said fourth digital filter response being a linear-phase imaginary response;

a third digital multiplier, receptive of said third digital filter response as its multiplicand signal and receptive of the digitized samples of said cosine wave of said controlled frequency as its multiplier signal, for generating a third product signal;

a fourth digital multiplier, receptive of said fourth digital filter response as its multiplicand signal and receptive of the digitized samples of said sine wave of said controlled frequency as its multiplier signal, for generating a fourth product signal;

a digital subtractor differentially combining said third and fourth product signals for generating a difference signal indicative of the departure of the frequency and phase of said controlled frequency from the carrier frequency of said final intermediate-frequency signal;

means responsive to said difference signal for supplying said digital control signal to said digital controlled oscillator;

a finite-impulse-response, narrow-bandpass, fifth digital filter receiving said digitized final intermediate-frequency signal from said analog-to-digital converter and providing after a latency time for said fifth digital filter a frequency-selective response to portions of said digitized final intermediate-frequency signal centering on its carrier frequency;

a digital delay line for delaying, by a delay equal to the latency time of said fifth digital filter, the digitized final intermediate-frequency signal generated by said analog-to-digital converter as said output signal therefrom, thereby to generate a delayed digitized final intermediate-frequency signal;

means for applying said delayed digitized final intermediate-frequency signal to said first and second digital filters as a shared input signal to each of them; and means for applying the frequency-selective response of said fifth digital filter to said third and fourth digital filters as a shared input signal to each of them.

12. A radio receiver as set forth in claim 11, further comprising:

a plurality of successive intermediate-frequency amplifier stages included within said tuner, at least one of which intermediate-frequency amplifier stages provides gain at an intermediate frequency different from said final intermediate-frequency band, at least two of which intermediate-frequency amplifier stages provide gain each in an amount controlled by a respective gain control signal;

means for applying said respective gain control signals, in respective amounts each controlled by an automatic gain control input signal;

a fifth digital multiplier, receptive of said third digital filter response as its multiplicand signal and receptive of the digitized samples of said sine wave of said controlled frequency as its multiplier signal, for generating a fifth product signal;

a sixth digital multiplier, receptive of said fourth digital filter response as its multiplicand signal and receptive of the digitized samples of said cosine wave of said controlled frequency as its multiplier signal, for generating a sixth product signal;

a second digital adder additively combining said fifth and sixth product signals for generating a second sum signal;

means for generating an analog lowpass filtered response to said second sum signal; and means for supplying said analog lowpass filtered response, at least under selected conditions, to said means for applying said respective gain control signals as said automatic gain control input signal.

13. A radio receiver as set forth in claim 12 wherein said means for applying said respective gain control signals includes an AGC delay network responsive to said automatic gain control input signal for applying said respective gain control signals.

14. A radio receiver as set forth in claim 13 wherein said means for supplying said analog lowpass filtered response, at least under selected conditions, to said means for applying said respective gain control signals as said automatic gain control input signal is of a type that supplies said analog lowpass filtered response under any and all conditions to said AGC delay network responsive as said automatic gain control input signal.

15. A radio receiver as set forth in claim 13 wherein said means for supplying said analog lowpass filtered response, at least under selected conditions, to said means for applying said respective gain control signals as said automatic gain control input signal comprises:

an analog-OR circuit receiving said analog lowpass filtered response as one of plural input signals thereto and supplying said automatic gain control input signal to said means for applying said respective gain control signals.

16. A radio receiver as set forth in claim 11, including:

a plurality of successive intermediate-frequency amplifier stages included within said tuner, at least one of which intermediate-frequency amplifier stages provides gain at an intermediate frequency different from said final intermediate-frequency band, at least two of which intermediate-frequency amplifier stages provide gain each in an amount controlled by a respective gain control signal;

means for applying said respective gain control signals, in respective amounts each controlled by an automatic gain control input signal;

means for generating an analog lowpass filtered response to said first sum signal; and means for supplying said analog lowpass filtered response, at least under selected conditions, to said means for applying said respective gain control signals as said automatic gain control input signal.

17. A radio receiver as set forth in claim 16 wherein said means for applying said respective gain control signals includes an AGC delay network responsive to said automatic gain control input signal for applying said respective gain control signals.

18. A radio receiver as set forth in claim 17 wherein said means for supplying said analog lowpass filtered response, at least under selected conditions, to said means for applying said respective gain control signals as said automatic gain control input signal is of a type that supplies said analog lowpass filtered response under any and all conditions to said AGC delay network responsive as said automatic gain control input signal.

19. A radio receiver as set forth in claim 17 wherein said means for supplying said analog lowpass filtered response, at least under selected conditions, to said means for applying said respective gain control signals as said automatic gain control input signal comprises:

an analog-OR circuit receiving said analog lowpass filtered response as one of plural input signals thereto and supplying said automatic gain control input signal to said means for applying said respective gain control signals.

20. A radio receiver as set forth in claim 1, wherein said digital circuitry for synchrodyning said digitized final intermediate-frequency signal to baseband further comprises:

a third digital multiplier, receptive of said first digital filter response as its multiplicand signal and receptive of the digitized samples of said cosine wave of said controlled frequency as its multiplier signal, for generating a third product signal;

a fourth digital multiplier, receptive of said second digital filter response as its multiplicand signal and receptive of the digitized samples of said sine wave of said controlled frequency as its multiplier signal, for generating a fourth product signal;

a digital subtractor differentially combining said third and fourth product signals for generating a difference signal indicative of the departure of the frequency and phase of said controlled frequency from the carrier frequency of said final intermediate-frequency signal; and a third digital filter generating a lowpass response to said difference signal, said lowpass response being indicative of the departure of the frequency and phase of said controlled frequency from the carrier frequency of said final intermediate-frequency signal; and means responsive to said lowpass response for supplying said digital control signal to said digital controlled oscillator.

21. A radio receiver as set forth in claim 20, including:

a plurality of successive intermediate-frequency amplifier stages included within said tuner, at least one of which intermediate-frequency amplifier stages provides gain at an intermediate frequency different from said final intermediate-frequency band, at least two of which intermediate-frequency amplifier stages provide gain each in an amount controlled by a respective gain control signal;

means for applying said respective gain control signals, in respective amounts each controlled by an automatic gain control input signal;

means for generating an analog lowpass filtered response to said first sum signal; and means for supplying said analog lowpass filtered response, at least under selected conditions, to said means for applying said respective gain control signals as said automatic gain control input signal.

22. A radio receiver as set forth in claim 21 wherein said means for applying said respective gain control signals includes an AGC delay network responsive to said automatic gain control input signal for applying said respective gain control signals.

23. A radio receiver as set forth in claim 22 wherein said means for supplying said analog lowpass filtered response, at least under selected conditions, to said means for applying said respective gain control signals as said automatic gain control input signal is of a type that supplies said analog lowpass filtered response under any and all conditions to said AGC delay network responsive as said automatic gain control input signal.

24. A radio receiver as set forth in claim 22 wherein said means for supplying said analog lowpass filtered response, at least under selected conditions, to said means for applying said respective gain control signals as said automatic gain control input signal comprises:

an analog-OR circuit receiving said analog lowpass filtered response as one of plural input signals thereto and supplying said automatic gain control input signal to said means for applying said respective gain control signals.

25. A radio receiver as set forth in claim 1 wherein said digitally controlled oscillator is of a type for generating digitized samples of a wave of said controlled frequency retarded in phase from said cosine wave of said controlled frequency by a prescribed angle, and for generating digitized samples of a wave of said controlled frequency retarded in phase from said sine wave of said controlled frequency by said prescribed angle, as well as for generating digitized samples of a cosine wave of a controlled frequency and for generating digitized samples of a sine wave of said controlled frequency.

26. A radio receiver as set forth in claim 25, wherein said digital circuitry for synchrodyning said digitized final intermediate-frequency signal to baseband further comprises:

finite-impulse-response, narrow-bandpass, third and fourth digital filters having identical response functions centering on the carrier frequency of said final intermediate-frequency signal, each of which said third and fourth digital filters exhibits a respective similar latency time, said third digital filter in cascade connection after said first digital filter for providing a frequency-selective response to said first digital filter response, said fourth digital filter in cascade connection after said second digital filter for providing a frequency-selective response to said second digital filter response;

a third digital multiplier, receptive of the frequency-selective response of said third digital filter as its multiplicand signal and receptive of the digitized samples of said wave of said controlled frequency retarded in phase from said cosine wave as its multiplier signal, for generating a third product signal;

a fourth digital multiplier, receptive of the frequency-selective response of said fourth digital filter as its multiplicand signal and receptive of the digitized samples of said wave of said controlled frequency retarded in phase from said sine wave as its multiplier signal, for generating a fourth product signal;

a digital subtractor differentially combining said third and fourth product signals for generating a difference signal indicative of the departure of the frequency and phase of said controlled frequency from the carrier frequency of said final intermediate-frequency signal; and means responsive to said difference signal for supplying said digital control signal to said digital controlled oscillator.

27. A radio receiver as set forth in claim 26, further comprising:

a plurality of successive intermediate-frequency amplifier stages included within said tuner, at least one of which intermediate-frequency amplifier stages provides gain at an intermediate frequency different from said final intermediate-frequency band, at least two of which intermediate-frequency amplifier stages provide gain each in an amount controlled by a respective gain control signal;

means for applying said respective gain control signals, in respective amounts each controlled by an automatic gain control input signal;

a fifth digital multiplier, receptive of the frequency-selective response of said third digital filter as its multiplicand signal and receptive of the digitized samples of said wave of said controlled frequency retarded in phase from said sine wave as its multiplier signal, for generating a fifth product signal;

a sixth digital multiplier, receptive of the frequency-selective response of said fourth digital filter as its multiplicand signal and receptive of the digitized samples of said wave of said controlled frequency retarded in phase from said cosine wave as its multiplier signal, for generating a second product signal;

a second digital adder additively combining said third and fourth product signals for generating a second sum signal;

means for generating an analog lowpass filtered response to said second sum signal; and means for supplying said analog lowpass filtered response, at least under selected conditions, to said means for applying said respective gain control signals as said automatic gain control input signal.

28. A radio receiver as set forth in claim 27 wherein said means for applying said respective gain control signals includes an AGC delay network responsive to said automatic gain control input signal for applying said respective gain control signals.

29. A radio receiver as set forth in claim 28 wherein said means for supplying said analog lowpass filtered response, at least under selected conditions, to said means for applying said respective gain control signals as said automatic gain control input signal is of a type that supplies said analog lowpass filtered response under any and all conditions to said AGC delay network responsive as said automatic gain control input signal.

30. A radio receiver as set forth in claim 28 wherein said means for supplying said analog lowpass filtered response, at least under selected conditions, to said means for applying said respective gain control signals as said automatic gain control input signal comprises:

an analog-OR circuit receiving said analog lowpass filtered response as one of plural input signals thereto and supplying said automatic gain control input signal to said means for applying said respective gain control signals.

31. A radio receiver as set forth in claim 26, including:

a plurality of successive intermediate-frequency amplifier stages included within said tuner, at least one of which intermediate-frequency amplifier stages provides gain at an intermediate frequency different from said final intermediate-frequency band, at least two of which intermediate-frequency amplifier stages provide gain each in an amount controlled by a respective gain control signal;

means for applying said respective gain control signals, in respective amounts each controlled by an automatic gain control input signal;

means for generating an analog lowpass filtered response to said first sum signal; and means for supplying said analog lowpass filtered response, at least under selected conditions, to said means for applying said respective gain control signals as said automatic gain control input signal.

32. A radio receiver as set forth in claim 31 wherein said means for applying said respective gain control signals includes an AGC delay network responsive to said automatic gain control input signal for applying said respective gain control signals.

33. A radio receiver as set forth in claim 32 wherein said means for supplying said analog lowpass filtered response, at least under selected conditions, to said means for applying said respective gain control signals as said automatic gain control input signal is of a type that supplies said analog lowpass filtered response under any and all conditions to said AGC delay network responsive as said automatic gain control input signal.

34. A radio receiver as set forth in claim 32 wherein said means for supplying said analog lowpass filtered response, at least under selected conditions, to said means for applying said respective gain control signals as said automatic gain control input signal comprises:

an analog-OR circuit receiving said analog lowpass filtered response as one of plural input signals thereto and supplying said automatic gain control input signal to said means for applying said respective gain control signals.

35. A radio receiver as set forth in claim 1, including:

a plurality of successive intermediate-frequency amplifier stages included within said tuner, at least one of which intermediate-frequency amplifier stages provides gain at an intermediate frequency different from said final intermediate-frequency band, at least two of which intermediate-frequency amplifier stages provide gain each in an amount controlled by a respective gain control signal;

means for applying said respective gain control signals, in respective amounts each controlled by an automatic gain control input signal;

means for generating an analog lowpass filtered response to said first sum signal; and means for supplying said analog lowpass filtered response, at least under selected conditions, to said means for applying said respective gain control signals as said automatic gain control input signal.

36. A radio receiver as set forth in claim 35 wherein said means for applying said respective gain control signals includes an AGC delay network responsive to said automatic gain control input signal for applying said respective gain control signals.

37. A radio receiver as set forth in claim 36 wherein said means for supplying said analog lowpass filtered response, at least under selected conditions, to said means for applying said respective gain control signals as said automatic gain control input signal is of a type that supplies said analog lowpass filtered response under any and all conditions to said AGC delay network responsive as said automatic gain control input signal.

38. A radio receiver as set forth in claim 36 wherein said means for supplying said analog lowpass filtered response, at least under selected conditions, to said means for applying said respective gain control signals as said automatic gain control input signal comprises:

an analog-OR circuit receiving said analog lowpass filtered response as one of plural input signals thereto and supplying said automatic gain control input signal to said means for applying said respective gain control signals.

39. A radio receiver as set forth in claim 1, wherein said first and second digital filters share a tapped delay line supplied input signal from said analog-to-digital converter, wherein said first digital filter additionally comprises a first weighted summation network for supplying a first weighted summation response to signals at selected taps of said tapped delay line, wherein said second digital filter additionally comprises a second weighted summation network for supplying a second weighted summation response to signals at selected taps of said tapped delay line, wherein said first digital filter includes at an output thereof a first 2:1 decimator for supplying said first digital filter response in selected response to said first weighted summation response, and wherein said second digital filter includes at an output thereof a second 2:1 decimator for supplying said second digital filter response in selected response to said second weighted summation response.

40. A radio receiver as set forth in claim 39; wherein said tapped delay line includes first through fourteenth clocked delay elements connected in cascade connection and clocked at said sample rate four times said symbol transmission rate; wherein said first weighted summation network comprises a first digital subtractor for subtracting the response of said fourteenth clocked delay element from the signal supplied to said first clocked delay element to generate a first difference signal, a second digital subtractor for subtracting the response of said ninth clocked delay element from the response of said third clocked delay element to generate a second difference signal, a third digital subtractor for subtracting the response of said seventh clocked delay element from the response of said fifth clocked delay element to generate a third difference signal, and means for weighting said first and second and third difference signals in 4:12:72 ratio and summing the results of such weighting for application to said first 2:1 decimator; wherein said second weighted summation network comprises a second digital adder for adding the response of said twelfth clocked delay element to the signal supplied to said first clocked delay element to generate a second sum signal, a third digital adder for adding the response of said tenth clocked delay element to the response of said second clocked delay element to generate a third sum signal, a fourth digital adder for adding the response of said eighth clocked delay element to the response of said fourth clocked delay element to generate a fourth sum signal, and means for weighting said second sum signal, said third sum signal, said fourth sum signal and the response of said eighth clocked delay element in 8:14:22:96 ratio and summing the results of such weighting for application to said second 2:1 decimator.

41. A digital television receiver for receiving digital television signals, each having a pilot carrier, having a vestigial sideband below the frequency of its pilot carrier and having a full sideband above the frequency of its pilot carrier, said digital television receiver comprising:

a tuner for selecting one of channels at different locations in a frequency band and frequency converting the selected channel to a final intermediate-frequency signal in a final intermediate-frequency band which has its lowest frequencies above zero frequency, said final intermediate-frequency signal having a vestigial sideband above the frequency of its pilot carrier and having a full sideband below the frequency of its pilot carrier;

an analog-to-digital converter for digitizing said final intermediate-frequency signal to generate as an output signal thereof a digitized final intermediate-frequency signal; and digital circuitry for synchrodyning said digitized final intermediate-frequency signal to baseband.

42. A digital television receiver as set forth in claim 41, wherein said digital circuitry for synchrodyning said digitized final intermediate-frequency signal to baseband comprises:

a digitally controlled oscillator for generating digitized samples of a cosine wave of a controlled frequency and digitized samples of a sine wave of said controlled frequency, said controlled frequency being controllable over a range of frequencies including the carrier frequency of said final intermediate-frequency signal in response to a digital control signal indicative of the difference of said controlled frequency from a desired frequency;

digital filter circuitry responsive to said digitized final intermediate-frequency signal digital for supplying descriptions in complex-number form of said final intermediate-frequency signal;

first and second narrow-bandpass digital filters having identical response functions centering on the carrier frequency of said final intermediate-frequency signal, each of which said first and second narrow-bandpass digital filters exhibits a respective similar latency time, said first narrow-bandpass filter for providing a frequency-selective response to real portions of the descriptions in complex-number form of said final intermediate-frequency signal, said second narrow-bandpass filter for providing a frequency-selective response to imaginary portions of the descriptions in complex-number form of said final intermediate-frequency signal;

a first digital multiplier, receptive of the frequency-selective response of said first narrow-bandpass digital filter as its multiplicand signal and receptive of the digitized samples of said cosine wave of said controlled frequency as its multiplier signal, for generating a first product signal;

a second digital multiplier, receptive of the frequency-selective response of said second narrow-bandpass digital filter as its multiplicand signal and receptive of the digitized samples of said sine wave of said controlled frequency as its multiplier signal, for generating a second product signal;

a digital subtractor differentially combining said first and second product signals for generating a difference signal indicative of the departure of the frequency and phase of said controlled frequency from the carrier frequency of said final intermediate-frequency signal;

means responsive to said difference signal for supplying said digital control signal to said digital controlled oscillator;

a first digital delay line for delaying said real portions of the descriptions in complex-number form of said final intermediate-frequency signal, by a delay equal to the latency time of said first narrow-bandpass digital filter, thus to generate delayed real portions of said final intermediate-frequency signal;

a second digital delay line for delaying said imaginary portions of the descriptions in complex-number form of said final intermediate-frequency signal, by a delay equal to the latency time of said second narrow-bandpass digital filter, thus to generate delayed imaginary portions of said final intermediate-frequency signal;

a third digital multiplier, receptive of the digitized samples of said cosine wave of said controlled frequency as its multiplier signal, for generating a third product signal;

means for applying to said third digital multiplier, as its multiplicand signal, said delayed real portions of said final intermediate-frequency signal;

a fourth digital multiplier, receptive of the digitized samples of said sine wave of said controlled frequency as its multiplier signal, for generating a fourth product signal;

means for applying to said fourth digital multiplier, as its multiplicand signal, said delayed imaginary portions of said final intermediate-frequency signal; and a digital adder additively combining said third and fourth product signals for generating a sum signal supplied as an output signal from said digital circuitry for synchrodyning said digitized final intermediate-frequency signal to baseband.

43. A digital television receiver as set forth in claim 41, wherein said digital circuitry for synchrodyning said digitized final intermediate-frequency signal to baseband comprises:

a digitally controlled oscillator for generating digitized samples of a cosine wave of a controlled frequency and digitized samples of a sine wave of said controlled frequency, said controlled frequency being controllable over a range of frequencies including the carrier frequency of said final intermediate-frequency signal in response to a digital control signal indicative of the difference of said controlled frequency from a desired frequency;

a narrow-bandpass digital filter having a narrow-bandpass filter response function centering on the carrier frequency of said final intermediate-frequency signal;

digital filter circuitry responsive to said narrow-bandpass filter response for supplying descriptions in complex-number form of said narrow-bandpass filter response;

a digital delay line for delaying said final intermediate-frequency signal, by a delay equal to the latency time of said narrow-bandpass digital filter, thus to generate a delayed final intermediate-frequency signal;

digital filter circuitry responsive to said delayed final intermediate-frequency signal digital for supplying descriptions in complex-number form of said delayed final intermediate-frequency signal;

a first digital multiplier, receptive of real portions of said descriptions in complex-number form of said narrow-bandpass digital filter response as its multiplicand signal and receptive of the digitized samples of said cosine wave of said controlled frequency as its multiplier signal, for generating a first product signal;

a second digital multiplier, receptive of imaginary portions of said descriptions in complex-number form of said narrow-bandpass digital filter response as its multiplicand signal and receptive of the digitized samples of said sine wave of said controlled frequency as its multiplier signal, for generating a second product signal;

a digital subtractor differentially combining said first and second product signals for generating a difference signal indicative of the departure of the frequency and phase of said controlled frequency from the carrier frequency of said final intermediate-frequency signal;

means responsive to said difference signal for supplying said digital control signal to said digital controlled oscillator;

a third digital multiplier, receptive of the digitized samples of said cosine wave of said controlled frequency as its multiplier signal, for generating a third product signal;

means for applying to said third digital multiplier, as its multiplicand signal, real portions of said delayed final intermediate-frequency signal;

a fourth digital multiplier, receptive of the digitized samples of said sine wave of said controlled frequency as its multiplier signal, for generating a fourth product signal;

means for applying to said fourth digital multiplier, as its multiplicand signal, imaginary portions of said delayed final intermediate-frequency signal; and a digital adder additively combining said third and fourth product signals for generating a sum signal supplied as an output signal from said digital circuitry for synchrodyning said digitized final intermediate-frequency signal to baseband.

44. A digital television receiver as set forth in claim 41, wherein said digital circuitry for synchrodyning said digitized final intermediate-frequency signal to baseband comprises:

a digitally controlled oscillator for generating digitized samples of a cosine wave of a controlled frequency and digitized samples of a sine wave of said controlled frequency, said controlled frequency being controllable over a range of frequencies including the carrier frequency of said final intermediate-frequency signal in response to a digital control signal indicative of the difference of said controlled frequency from a desired frequency;

digital filter circuitry responsive to said digitized final intermediate-frequency signal digital for supplying descriptions in complex-number form of said final intermediate-frequency signal;

a first digital multiplier, receptive of real portions of the descriptions in complex-number form of said final intermediate-frequency signal as its multiplicand signal and receptive of the digitized samples of said cosine wave of said controlled frequency as its multiplier signal, for generating a first product signal;

a second digital multiplier, receptive of imaginary portions of the descriptions in complex-number form of said final intermediate-frequency signal as its multiplicand signal and receptive of the digitized samples of said sine wave of said controlled frequency as its multiplier signal, for generating a second product signal;

a digital subtractor differentially combining said first and second product signals for generating a difference signal indicative of the departure of the frequency and phase of said controlled frequency from the carrier frequency of said final intermediate-frequency signal;

means responsive to said difference signal for supplying said digital control signal to said digital controlled oscillator, said means for supplying said digital control signal including a lowpass filter responsive to said difference signal;

a third digital multiplier, receptive of the digitized samples of said cosine wave of said controlled frequency as its multiplier signal, and receptive of real portions of the descriptions in complex-number form of said final intermediate-frequency signal as its multiplicand signal, for generating a third product signal;

a fourth digital multiplier, receptive of the digitized samples of said sine wave of said controlled frequency as its multiplier signal, and receptive of imaginary portions of the descriptions in complex-number form of said final intermediate-frequency signal as its multiplicand signal, for generating a fourth product signal;

a digital adder additively combining said third and fourth product signals for generating a sum signal supplied as an output signal from said digital circuitry for synchrodyning said digitized final intermediate-frequency signal to baseband.

45. A digital television receiver as set forth in claim 41, wherein said digital circuitry for synchrodyning said digitized final intermediate-frequency signal to baseband comprises:

a digitally controlled oscillator for generating digitized samples of a cosine wave of a controlled frequency, digitized samples of a wave of said controlled frequency retarded in phase from said cosine wave of said controlled frequency by a prescribed angle, digitized samples of a sine wave of said controlled frequency, and digitized samples of a wave of said controlled frequency retarded in phase from said sine wave of said controlled frequency by said prescribed angle said controlled frequency being controllable over a range of frequencies including the carrier frequency of said final intermediate-frequency signal in response to a digital control signal indicative of the difference of said controlled frequency from a desired frequency;

digital filter circuitry responsive to said digitized final intermediate-frequency signal digital for supplying descriptions in complex-number form of said final intermediate-frequency signal;

first and second narrow-bandpass digital filters having identical response functions centering on the carrier frequency of said final intermediate-frequency signal, each of which said first and second narrow-bandpass digital filters exhibits a respective similar latency time, said first narrow-bandpass filter for providing a frequency-selective response to real portions of the descriptions in complex-number form of said final intermediate-frequency signal, said second narrow-bandpass filter for providing a frequency-selective response to imaginary portions of the descriptions in complex-number form of said final intermediate-frequency signal;

a first digital multiplier, receptive of the frequency-selective response of said first narrow-bandpass digital filter as its multiplicand signal and receptive of the digitized samples of said cosine wave of said controlled frequency as its multiplier signal, for generating a first product signal;

a second digital multiplier, receptive of the frequency-selective response of said second narrow-bandpass digital filter as its multiplicand signal and receptive of the digitized samples of said sine wave of said controlled frequency as its multiplier signal, for generating a second product signal;

a digital subtractor differentially combining said first and second product signals for generating a difference signal indicative of the departure of the frequency and phase of said controlled frequency from the carrier frequency of said final intermediate-frequency signal;

means responsive to said difference signal for supplying said digital control signal to said digital controlled oscillator;

a third digital multiplier, receptive of the digitized samples of said wave of said controlled frequency retarded in phase from said cosine wave of said controlled frequency by said prescribed angle as its multiplier signal, and receptive of real portions of the descriptions in complex-number form of said final intermediate-frequency signal as its multiplicand signal, for generating a third product signal;

a fourth digital multiplier, receptive of the digitized samples of said wave of said controlled frequency retarded in phase from said sine wave of said controlled frequency by said prescribed angle as its multiplier signal, and receptive of imaginary portions of the descriptions in complex-number form of said final intermediate-frequency signal as its multiplicand signal, for generating a fourth product signal; and a digital adder additively combining said third and fourth product signals for generating a sum signal supplied as an output signal from said digital circuitry for synchrodyning said digitized final intermediate-frequency signal to baseband.

* * * * *